US011163646B2

(12) United States Patent
Gim

(10) Patent No.: US 11,163,646 B2
(45) Date of Patent: Nov. 2, 2021

(54) MEMORY SYSTEM FOR DETECTING ERASED PAGE INCLUDING MEMORY CELLS WITH DISTORTED THRESHOLD VOLTAGES, AND OPERATION METHOD THEREOF

(71) Applicant: SK hynix Inc., Gyeonggi-do (KR)

(72) Inventor: Yeong Dong Gim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 193 days.

(21) Appl. No.: 16/286,020

(22) Filed: Feb. 26, 2019

(65) Prior Publication Data
US 2020/0050515 A1 Feb. 13, 2020

(30) Foreign Application Priority Data

Aug. 10, 2018 (KR) .......................... 10-2018-0093814

(51) Int. Cl.
*G06F 11/00* (2006.01)
*G06F 11/14* (2006.01)
*G06F 12/02* (2006.01)
*G11C 16/16* (2006.01)
*G11C 16/26* (2006.01)

(52) U.S. Cl.
CPC ...... *G06F 11/1441* (2013.01); *G06F 11/1417* (2013.01); *G06F 12/0238* (2013.01); *G11C 16/16* (2013.01); *G11C 16/26* (2013.01); *G11C 2216/22* (2013.01)

(58) Field of Classification Search
None
See application file for complete search history.

(56) References Cited

U.S. PATENT DOCUMENTS

| | | | |
|---|---|---|---|
| 9,390,808 B1 * | 7/2016 | Kato | G11C 16/14 |
| 2013/0073786 A1 * | 3/2013 | Belgal | G06F 12/0246 |
| | | | 711/103 |
| 2015/0113237 A1 * | 4/2015 | Kim | G11C 16/225 |
| | | | 711/162 |
| 2016/0170871 A1 * | 6/2016 | Hyun | G06F 3/0653 |
| | | | 711/103 |
| 2018/0107412 A1 * | 4/2018 | Jun | G06F 3/0688 |
| 2018/0122490 A1 * | 5/2018 | Kim | G11C 16/3459 |
| 2018/0181346 A1 * | 6/2018 | Kim | G06F 3/0659 |
| 2018/0358098 A1 * | 12/2018 | Cha | G11C 16/10 |

FOREIGN PATENT DOCUMENTS

| KR | 10-2016-0143371 | 12/2016 |
|---|---|---|
| KR | 10-2019-0035280 | 4/2019 |

OTHER PUBLICATIONS

NPL Search: Google Scholar/Patents—text refined. (Year: 2020).*
Google Scholar/Patents—text refined (Year: 2021).*

* cited by examiner

*Primary Examiner* — Christopher S McCarthy
(74) *Attorney, Agent, or Firm* — IP & T Group LLP

(57) ABSTRACT

An operation method of a memory system includes performing a first read operation on a word line corresponding to a read command, using a read voltage set including a first read voltage; performing a second read operation on the word line using a second read voltage greater than the first read voltage, depending on whether error correction on data read through the first read operation fails; and determining a memory block that includes a memory cell to which the word line is coupled as a closed memory block, depending on whether the word line is determined to be an erased word line as the result of the second read operation.

8 Claims, 21 Drawing Sheets

MEMORY SYSTEM FOR DETECTING ERASED PAGE INCLUDING MEMORY CELLS WITH DISTORTED THRESHOLD VOLTAGES, AND OPERATION METHOD THEREOF

CROSS-REFERENCE TO RELATED APPLICATION

This application claims priority under 35 U.S.C. § 119(a) to Korean Patent Application No. 10-2018-0093814, filed on Aug. 10, 2018, which is incorporated herein by reference in its entirety.

BACKGROUND

1. Field

Various embodiments relate to a memory system, and more particularly, to a memory system including a memory device and an operation method thereof.

2. Discussion of the Related Art

The computer environment paradigm has been transitioning to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Since they have no moving parts, memory systems provide advantages such as excellent stability and durability, high information access speed, and low power consumption. Examples of memory systems having such advantages include universal serial bus (USB) memory devices, memory cards having various interfaces, and solid state drives (SSDs).

SUMMARY

Various embodiments are directed to a memory system capable of improving performance and reliability by accurately determining an erase page, and an operation method thereof.

In an embodiment, an operation method of a memory system may include: performing a first read operation on a word line corresponding to a read command, using a read voltage set including a first read voltage; performing a second read operation on the word line using a second read voltage greater than the first read voltage, depending on whether error correction on data read through the first read operation fails; and determining a memory block that includes a memory cell to which the word line is coupled as a closed memory block, depending on whether the word line is determined to be an erased word line as the result of the second read operation.

In an embodiment, an operation method of a memory system may include: performing an open block scanning operation of searching for an erased word line by repeatedly determining whether each of word lines included in an open memory block is an erased word line, when the memory system is powered up after a sudden power-off (SPO); and performing a repair operation on the erased word line, wherein the determining of whether a word line is the erased word line comprises: performing a first read operation by applying a first read voltage to the word line; performing a second read operation by applying a second read voltage greater than the first read voltage, depending on the number of erased cells included in the word line as the result of the first read operation; and determining that the word line is an erased word line, according to the result of the second read operation.

In an embodiment, a memory system may include: a memory device suitable for storing data; and a controller suitable for controlling the memory device, wherein the controller comprises an erase determiner suitable for determining whether a word line corresponding to a read command is an erased word line, wherein the erase determiner determines whether the word line is an erased word line, by performing a second read operation using a second read voltage greater than a first read voltage, depending on whether error correction on data read through a first read operation using a read voltage set including the first read voltage fails.

In an embodiment, a memory system may include: a memory device suitable for storing data; and a controller suitable for controlling the memory device, wherein the controller comprises an erase determiner suitable for determining whether a word line corresponding to a read command is an erased word line, wherein the erase determiner determines whether the word line is an erased word line, by performing a second read operation using a second read voltage greater than a first read voltage, depending on the number of erased cells included in the word line read through a first read operation using the first read voltage.

In an embodiment, a memory system may include: a memory device suitable for storing data; and a controller suitable for controlling the memory device, wherein the controller is suitable for: performing a first read operation on a word line using a first read voltage in response to a read request; performing error correction on data read by the first read operation; when the error correction on the read data fails, performing a second read operation on the word line using a second read voltage greater than the first read voltage; determining whether the word line is an erased word line based on the number of erase memory cells among memory cells coupling to the word line; and performing a disturb handling operation on a memory block that includes the erased word line.

DETAILED DESCRIPTION

Various embodiments will be described in detail with reference to the accompanying drawings. The following description focuses on portions required for understanding operations in accordance with the present embodiments; description of well-known technical information is omitted so as not to unnecessarily obscure aspects and features of the present embodiments.

Throughout the specification, reference to "an embodiment," "another embodiment" or the like is not necessarily to only one embodiment, and different references to any such phrase are not necessarily to the same embodiment(s).

Figure 1:
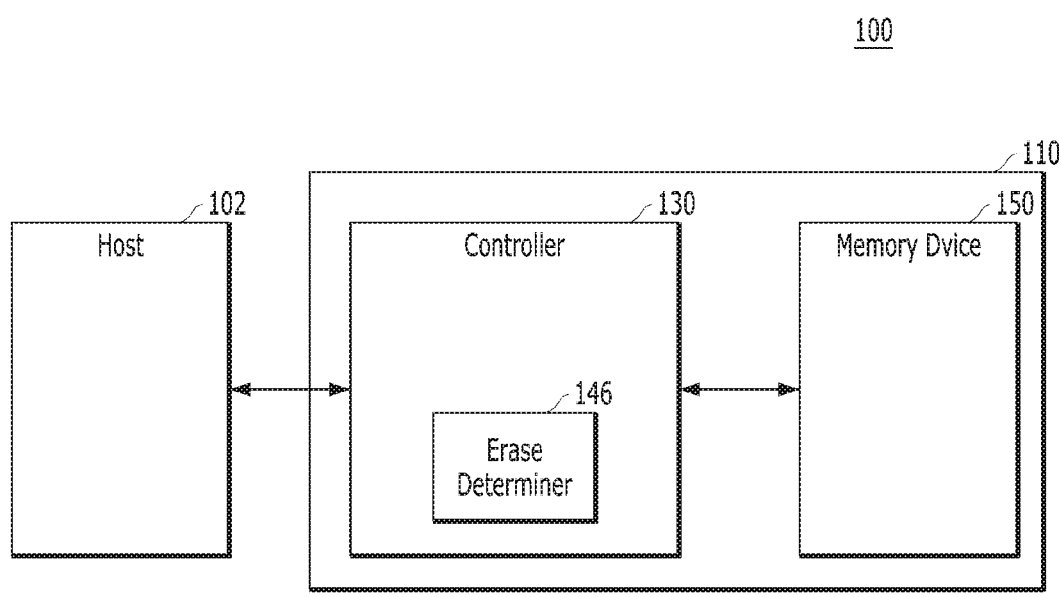
FIG. 1 is a block diagram illustrating a data processing system including a memory system in accordance with an embodiment of the present invention.

FIG. 1 schematically illustrates a data processing system 100 including a memory system in accordance with an embodiment.

Referring to FIG. 1, the data processing system 100 may include a host 102 and a memory system 110. The memory system 110 may store data therein or output data stored therein in response to a request of the host 102.

The memory system 110 may include a memory device 150 for storing data and a controller 130 for controlling the memory device 150. The memory device 150 may include a nonvolatile memory device. The memory device 150 may include a plurality of memory cells. The memory device 150 will be described in detail with reference to FIG. 4.

The controller 130 may control the memory device 150 in response to a request of the host 102. For example, the controller 130 may process a write request by providing a write command, an address and data to the memory device 150 in response to the write request of the host 102. For another example, the controller 130 may process a read request by providing a read command and an address to the memory device 150 in response to the read request of the host 102, and providing data read from the memory device 150 to the host 102.

When the memory device 150 repeatedly performs a read operation on a specific memory cell, the threshold voltage of an adjacent memory cell may change due to disturbance. This phenomenon will be described in detail with reference to FIGS. 5 to 7. A memory cell in an erase state, i.e., an erased cell may be read as a memory cell in a program state, i.e., a programmed cell, due to the disturbance. The erased word line may be read as a programmed word line due to the disturbance.

The controller 130 may include an erase determiner 146.

The erase determiner 146 may determine whether a word line read in response to a read command is erased, according to the number of erased bits included in data which are read from the memory device 150. The data may be read from the memory device 150 by applying a first read voltage to the word line in response to the read command.

The erase determiner 146 may control the memory device 150 to perform a second read operation on the word line using a second read voltage to be described below, depending on the number of erased bits. Further, the erase determiner 146 may determine whether the word line is erased, according to the number of erased bits in the data read through the second read operation.

Figure 2:
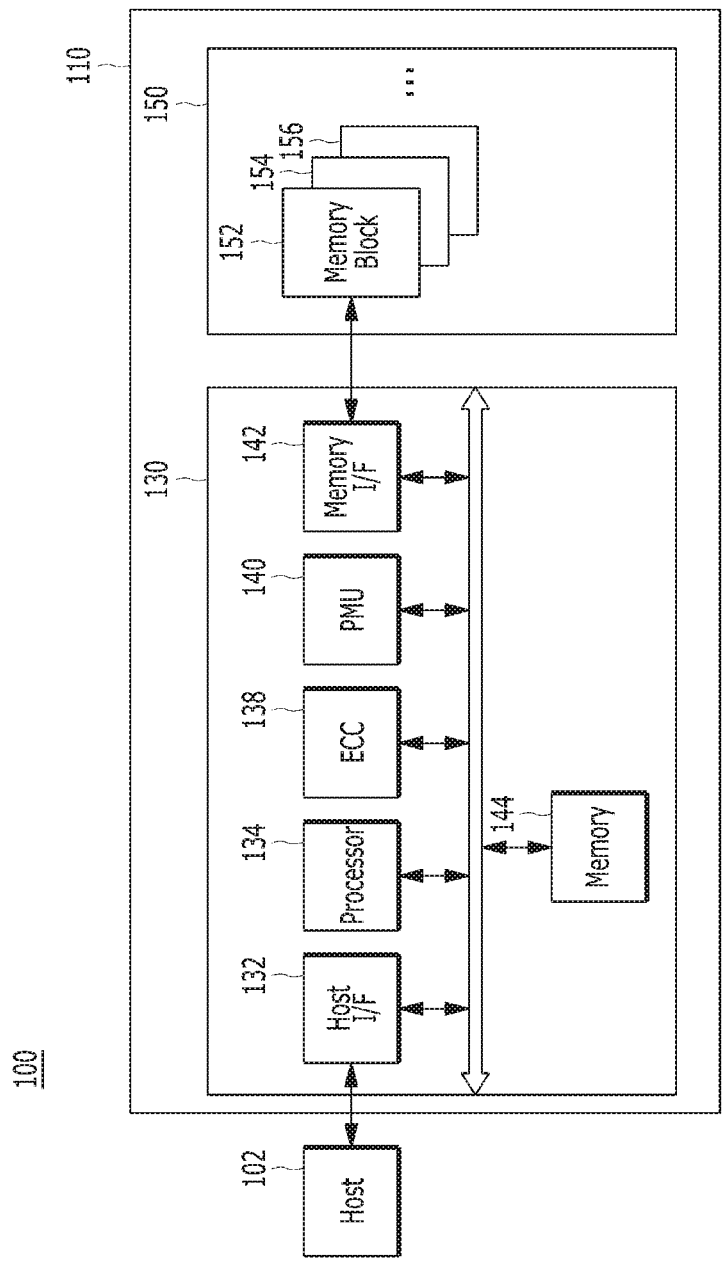
FIG. 2 is a block diagram illustrating a data processing system including a memory system in accordance with an embodiment.

FIG. 2 is a block diagram illustrating a data processing system 100 in accordance with an embodiment of the present invention.

Referring to FIG. 2, the data processing system 100 may include a host 102 operatively coupled to a memory system 110.

The host 102 may include any of various portable electronic devices such as a mobile phone, an MP3 player and a laptop computer, or any of various non-portable electronic devices such as a desktop computer, a game machine, a television (TV), and a projector.

The host 102 may include at least one operating system (OS), which may manage and control overall functions and operations of the host 102, and provide operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include a plurality of OSs, and execute an OS to perform an operation corresponding to a user's request on the memory system 110.

The memory system 110 may operate to store data for the host 102 in response to a request of the host 102. Non-limiting examples of the memory system 110 include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and/or micro-MMC. The SD card may include a mini-SD card and/or micro-SD card.

The memory system 110 may be embodied by any of various types of storage devices. Examples of such storage devices include, but are not limited to, volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) and a flash memory. The flash memory may have a 3-dimensional (3D) stack structure.

The memory system 110 may include a controller 130 and a memory device 150. The memory device 150 may store data for the host 102, and the controller 130 may control data storage into the memory device 150.

The controller 130 and the memory device 150 may be integrated into a single semiconductor device, which may be included in any of the various types of memory systems exemplified above. For example, the controller 130 and the memory device 150 may be integrated as one semiconductor device to constitute a solid state drive (SSD). When the memory system 110 is used as an SSD, the operating speed of the host 102 connected to the memory system 110 can be improved. In another example, the controller 130 and the memory device 150 may be integrated as one semiconductor device to constitute a memory card such as a personal computer memory card international association (PCMCIA) card, compact flash (CF) card, smart media (SM) card, memory stick, multimedia card (MMC) including reduced size MMC (RS-MMC) and micro-MMC, secure digital (SD) card including mini-SD, micro-SD and SDHC, or universal flash storage (UFS) device.

Non-limiting application examples of the memory system 110 include a computer, an ultra mobile PC (UMPC), a workstation, a net-book, a personal digital assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied.

The memory device 150 may store data provided from the host 102 through a write operation, and provide data stored therein to the host 102 through a read operation. The memory device 150 may include a plurality of memory blocks 152, 154, 156 . . . , each of which may include a plurality of pages, and each of the pages may include a plurality of memory cells coupled to a word line. In an embodiment, the memory device 150 may be a flash memory. The flash memory may have a 3-dimensional (3D) stack structure.

Since the structure of the memory device 150 will be described in detail later with reference to FIGS. 3 to 4, further description thereof is omitted here.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) 132, a processor 134, an error correction code (ECC) component 138, a power management unit (PMU) 140, a memory I/F 142 such as a NAND flash controller (NFC), and a memory 144, all operatively coupled via an internal bus.

The host interface 132 may be configured to process a command and data of the host 102. The host interface 132 may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATH), enhanced small disk interface (ESDI) and integrated drive electronics (IDE).

The ECC component 138 may detect and correct an error contained in the data read from the memory device 150. In other words, the ECC component 138 may perform an error correction decoding process on the data read from the memory device 150 through an ECC code used during an ECC encoding process. According to a result of the error correction decoding process, the ECC component 138 may output a signal, for example, an error correction success/fail signal. When the number of error bits is greater than a threshold value of correctable error bits, the ECC component 138 may not correct the error bits, and instead may output an error correction fail signal.

The ECC component 138 may perform error correction through a coded modulation such as low density parity check (LDPC) code, Bose-Chaudhri-Hocquenghem (BCH) code, turbo code, Reed-Solomon (RS) code, convolution code, recursive systematic code (RSC), trellis-coded modulation (TCM) and block coded modulation (BCM). However, the ECC component 138 is not limited to any specific error correction technique or structure. The ECC component 138 may include any and all circuits, modules, systems or devices for suitable error correction.

The PMU 140 may provide and manage power of the controller 130.

The memory I/F 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the memory I/F 142 may generate a control signal for the memory device 150 and process data to be provided to the memory device 150 under the control of the processor 134. The memory I/F 142 may work as an interface (e.g., a NAND flash interface) for processing a command and data between the controller 130 and the memory device 150. Specifically, the memory I/F 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or externally to the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL). Also, the processor 134 may be realized as a microprocessor or a central processing unit (CPU).

For example, the controller 130 may perform an operation requested by the host 102 in the memory device 150 through the processor 134, which is realized as a microprocessor or a CPU. In other words, the controller 130 may perform a command operation corresponding to a command received from the host 102, or other source. The controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command or a set feature command.

Also, the controller 130 may perform a background operation onto the memory device 150 through the processor 134, which is realized as a microprocessor or a CPU. The background operation performed onto the memory device 150 may include copying and processing data stored in some memory blocks among the memory blocks 152 to 156 of the memory device 150 into other memory blocks, e.g., a garbage collection (GC) operation, an operation of swapping data between select memory blocks, e.g., a wear-leveling (WL) operation, an operation of storing the map data stored in the controller 130 in the memory blocks 152 to 156, e.g., a map flush operation, or an operation of managing had blocks of the memory device 150, e.g., a bad block management operation of detecting and processing bad blocks among the memory blocks 152 to 156.

In an embodiment, the erase determiner 146 described with reference to FIG. 1 may be implemented through the processor 134 and the memory 144 which are included in the controller 130 described with reference to FIG. 2.

A memory device of the memory system in accordance with an embodiment of the present invention is described in detail with reference to FIGS. 3 to 4.

Figure 3:
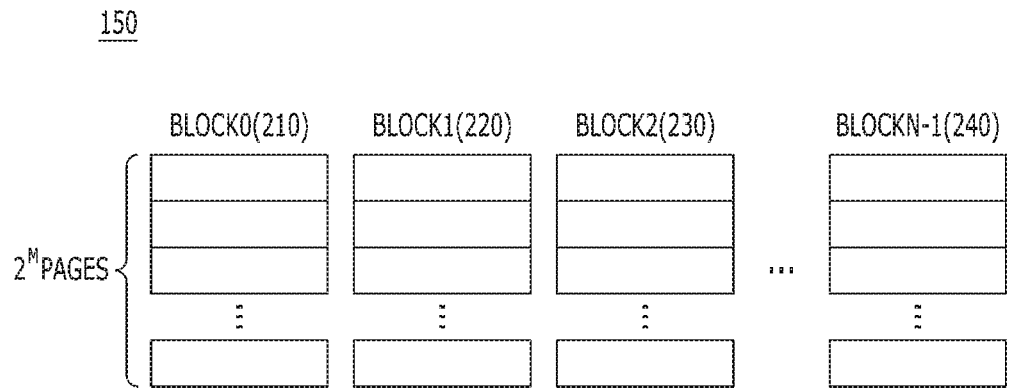
FIG. 3 is a schematic diagram illustrating a memory device employed in the memory system of FIG. 2.

FIG. 3 is a schematic diagram illustrating a memory device, e.g., the memory device 150 of FIG. 1, in accordance with an embodiment of the present invention. FIG. 4 is a circuit diagram illustrating an exemplary configuration of a memory cell array of a memory block in the memory device 150.

Referring to FIG. 3, the memory device 150 may include a plurality of memory blocks BLOCK0 (210), BLOCK1 (220), BLOCK2 (230), and to BLOCKN-1 (240). Each of the memory blocks 210, 220, 230 and 240 may include a plurality of pages, for example $2^M$ pages, the number of which may vary according to circuit design. For example, in some applications, each of the memory blocks may include M pages. Each of the pages may include a plurality of memory cells that are coupled to a plurality of word lines WL.

Memory cells in the memory blocks may be any of a single level cell (SLC) memory block storing 1-bit data and/or a multi-level cell (MLC) memory block storing 2 or more bits data. The SLC memory blocks may include a plurality of pages that are realized by memory cells storing one-bit data in one memory cell. The SLC memory blocks may have a quick data operation performance and high durability. On the other hand, the MLC memory blocks may include a plurality of pages that are realized by memory cells storing multi-bit data, e.g., data of two or more bits, in one memory cell. The MLC memory blocks may have a greater data storing space than the SLC memory blocks. In other words, the MLC memory blocks may be highly integrated. Particularly, the memory device 150 may include not only the MLC memory blocks, each of which includes a plurality of pages that are realized by memory cells capable of storing two-bit data in one memory cell, but also other types of MLC memory blocks such as triple level cell (TLC) memory blocks each of which includes a plurality of pages that are realized by memory cells capable of storing three-bit data in one memory cell, quadruple level cell (QLC) memory blocks each of which includes a plurality of pages that are realized by memory cells capable of storing four-bit data in one memory cell, and/or still higher-multiple level cell memory blocks each of which includes a plurality of pages that are realized by memory cells capable of storing five or more-bit data in one memory cell.

In accordance with an embodiment of the present invention, the memory device 150 is described as a non-volatile memory, such as a flash memory, e.g., a NAND flash memory. However, the memory device 150 may be realized as any of a phase change random access memory (PCRAM), a resistive random access memory (RRAM or ReRAM), a ferroelectric random access memory (FRAM), a spin transfer torque magnetic random access memory (STT-RAM or STT-MRAM).

The memory blocks 210, 220, 230 and 240 may store the data transferred from the host 102 through a program operation, and transfer data stored therein to the host 102 through a read operation.

Figure 4:
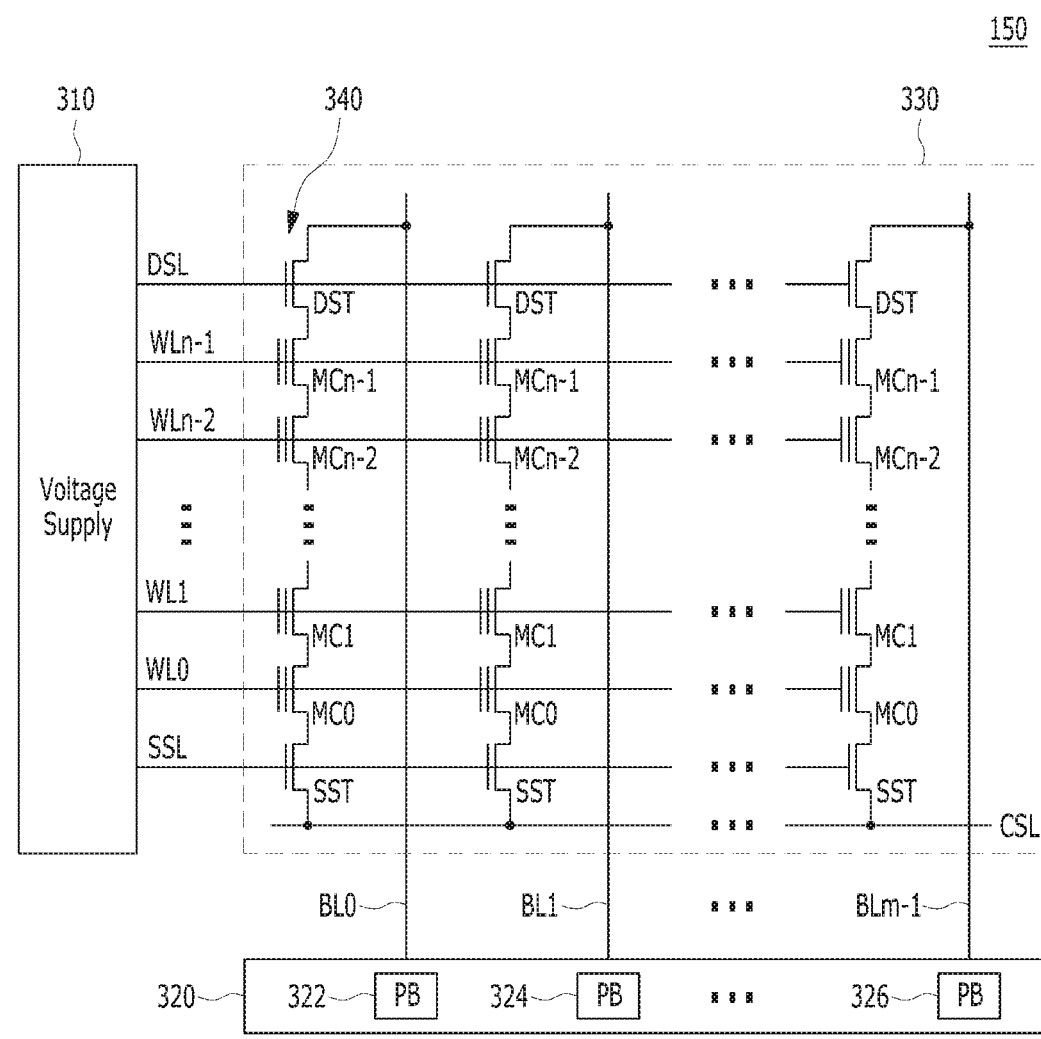
FIG. 4 is a circuit diagram illustrating an exemplary configuration of a memory cell array of a memory block in the memory device shown in FIG. 2.

Referring to FIG. 4, a memory block 330 which may correspond to any of the plurality of memory blocks 152 to 156 in the memory device 150 of the memory system 110, is illustrated. The memory block 330 may include a plurality of cell strings 340 coupled to a plurality of corresponding bit lines BL0 to BLm-1. The cell string 340 of each column may include one or more drain select transistors DST and one or more source select transistors SST. Between the drain and ground select transistors DST and SST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 340 may be electrically coupled to a corresponding bit line among the plurality of bit lines BL0 to BLm-1. For example, as illustrated in FIG. 4, the first cell string is coupled to the first bit line BL0, and the last cell string is coupled to the last bit line BLm-1. For reference, in FIG. 4, 'DSL' denotes a drain select line, 'SSL' denotes a source select line, and 'CSL' denotes a common source line.

Although FIG. 4 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read and write (read/write) circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers (PBs) 322 to 326 respectively corresponding to columns (or bit lines) or column pairs (or bit line pairs), and each of the page buffers 322 to 326 may include a plurality of latches (not illustrated).

The memory device 150 may be implemented with a two-dimensional or three-dimensional memory device. Each of the memory blocks 330 in the memory device 150 may include a plurality of NAND strings extending in a second direction, and a plurality of NAND strings extending in first and third directions. Each of the NAND strings may be coupled to a bit line, one or more string select lines, one or more ground select lines, a plurality of word lines, one or more dummy word lines and a common source line, and include a plurality of transistor structures.

Figure 5:
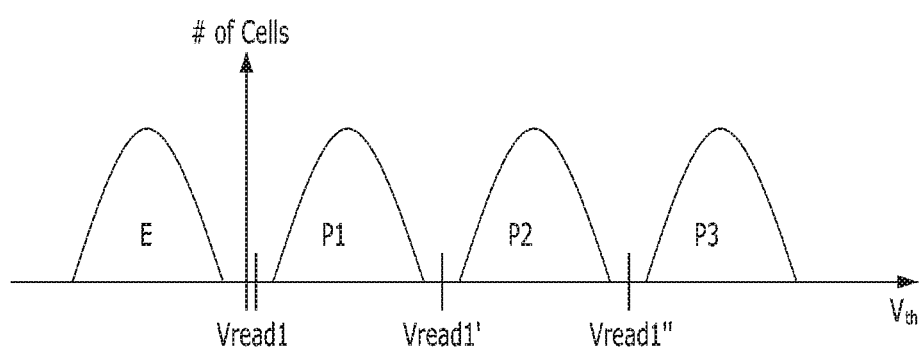
FIG. 5 is a diagram illustrating threshold voltage distributions of a memory system.

FIG. 5 illustrates threshold voltage distributions of the memory system 110 of FIGS. 1 and 2.

Referring to FIG. 5, the threshold voltages of memory cells having the same data programmed therein may be within a threshold voltage distribution range, as a result of minute differences in electrical characteristic among a plurality of memory cells. For example, when a multi-level cell (MLC) is programmed, the MLC may have any one of three program states P1 to P3 and one erase state E. FIG. 5 illustrates an ideal distribution of the MLC, in which threshold voltage distributions do not overlap each other, but each has a read voltage margin range.

The voltage supply 310 may apply a first read voltage set of Vread1, Vread1' and Vread1" to the word line, such that the threshold voltage states of the respective memory cells coupled to the word line can be distinguished to read data.

For example, when a first read voltage Vread1, which is the lowest read voltage of the first read voltage set, is applied to a word line coupled to the MLC, a current may flow through a bit line to which a memory cell having the erase state E is coupled, and no current may flow through a bit line to which memory cell having the program state P1, P2 or P3 is coupled. Therefore, the erase state E and the program states P1 to P3 can be clearly distinguished through the read operation.

Figure 6:
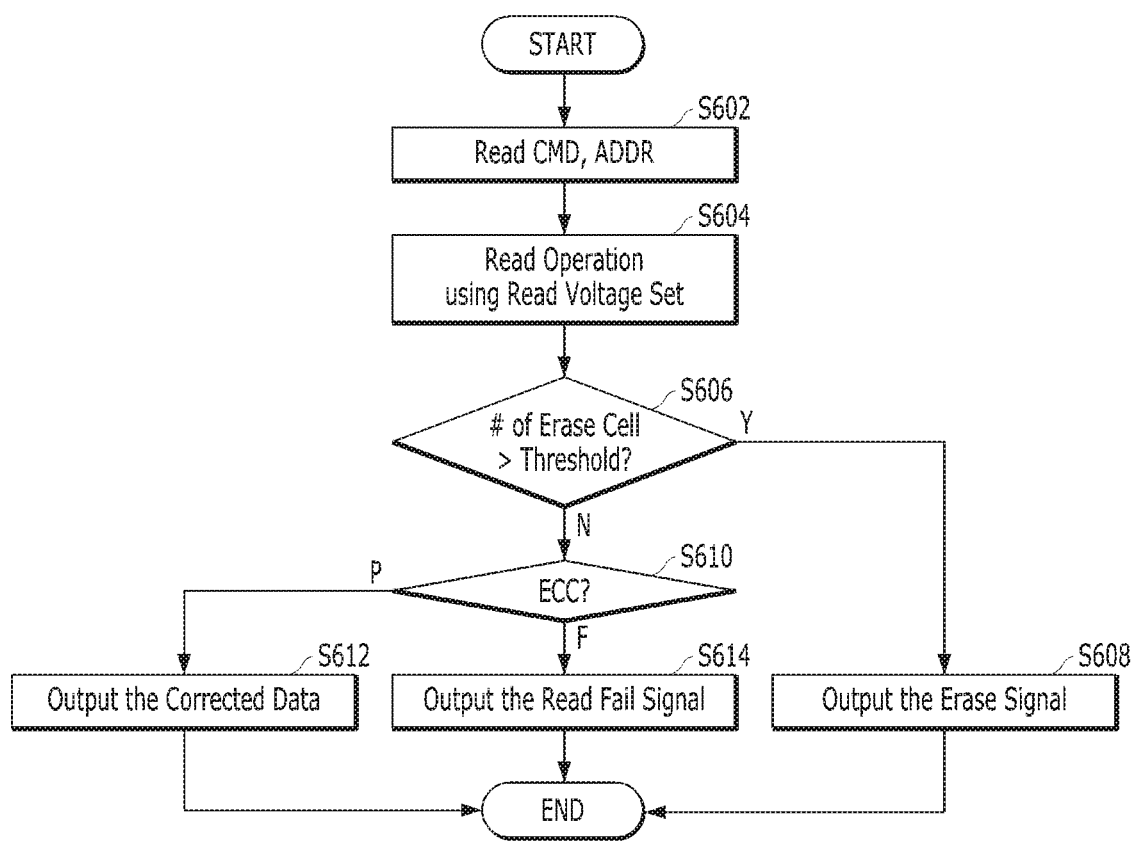
FIG. 6 is a flowchart illustrating a conventional read operation of a memory system.

FIG. 6 is a flowchart illustrating a conventional read operation of a memory system.

The memory system may include a memory device and a controller for controlling the memory device to perform the read operation.

At step S602, a processor of the controller provides a read command CMD and a read address ADDR to the memory device in order to perform a read operation.

At step S604, the memory device reads data by applying a read voltage to a word line corresponding to the read address in response to the read command. The memory device provides the read data to the controller.

At step S606, the processor determines whether the number of erased cells among memory cells coupled to the word line exceeds a threshold value, by referring to the read data.

When the number of erased cells (i.e., #of Erase Cell) exceeds the threshold value ("Y" at step S606), the processor outputs an erase signal at step S608.

When the number of erased cells is less than or equal to the threshold value ("N" at step S606), an ECC unit in the controller may perform error correction on the read data at step S610.

When the error correction succeeded ("P" at step S610), the ECC unit stores the corrected data in a memory of the controller at step S612. When the read operation is performed according to a request from the host, the processor provides the data stored in the memory of the controller to the host through a host interface.

When the error correction failed ("F" at step S610), the ECC unit outputs a read fail signal to the processor at step S614.

Figure 7:
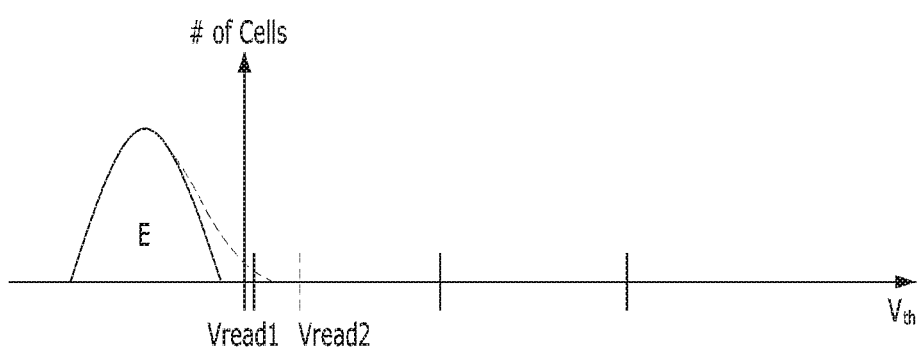
FIG. 7 is a diagram illustrating a threshold voltage distribution of a memory system.

FIG. 7 illustrates threshold voltage distributions of the memory system 110.

When a read operation is performed, a pass voltage may also be applied to an unselected word line. Thus, disturbance may occur to raise the threshold voltage of an adjacent memory cell. When the disturbance becomes severe enough to significantly change the threshold voltage of a memory cell, data stored in the corresponding memory cell may be distorted.

An open memory block may indicate a memory block of which some memory cells are completely programmed and the other memory cells are erased. In other words, an open memory block may indicate a memory block of which all memory cells are not yet completely programmed.

When a read voltage is repeatedly applied to a specific word line in the open memory block, the threshold voltages of adjacent erased cells may rise due to disturbance. FIG. 7 illustrates a threshold voltage distribution of erased cells due to the disturbance.

When an erased word line is affected by the disturbance as illustrated in FIG. 7, some memory cells may be read as programmed cells during a read operation of the memory device 150. That is because some of memory cells coupled to the erased word line may have a higher threshold voltage than the first read voltage Vread1 due to the disturbance, and no current may flow through bit lines coupled to the some memory cells, respectively, even though the first read voltage Vread1 is applied to the word line.

Referring back to FIG. 6, when the number of memory cells read as programmed memory cells due to the disturbance exceeds the threshold value, even though the word line is not a programmed word line, the processor determines, at step S606, that the number of erased cells in the word line is less than or equal to the threshold value. Depending on the determination result, the ECC unit performs error correction decoding at step S610. Since the word line was not programmed, the error correction may fail because there is no valid data in the word line.

Therefore, when a read fail occurred due to failure of error correction on data read by performing a read operation on a certain word line, it is not possible to distinguish whether the read fail occurred with the corresponding word line programmed or occurred with the corresponding word line erased. This may degrade the reliability and performance of the memory system 110.

For example, when a read fail occurred at step S614 as the result of the read operation on the word line, the memory system further performs a read recovery operation to recover the data corresponding to the word line. The read recovery operation may include a soft decision operation and/or a read retry operation. Both the soft decision operation and the read retry operation may include an operation of outputting data from the memory device by reapplying a read voltage to the corresponding word line and an operation of performing error correction decoding on the output data again.

When a mapping error occurred between a logical address and a physical address of the memory system 110 or a garbage collection read operation is performed, a read operation may be performed on an erased word line. Although a read fail on data read from the erased word line occurs as described with reference to FIG. 7, the read data do not need to be recovered because the word line was not programmed. However, when error correction on the read data fails, the processor 134 may unconditionally perform a read recovery operation on the erased word line. Therefore, the performance of the memory system 110 may be degraded.

For another example, when the controller 130 performs a sudden power-off recovery operation while the memory system 110 is powered up after a sudden power-off, an error may occur. Specifically, the processor 134 may search for a first erased word line of an open memory block by performing an open memory block scan operation, and then control the memory device 150 to perform a repair operation on the first erased word line, for example, a dummy data program operation. In this instance, when an erased word line affected by disturbance is determined to be a programmed word line as described below, the repair operation may be performed on another word line instead of the first erased word line. The first erased word line may correspond to the next page of the finally programmed word line in the open memory block.

Figure 8:
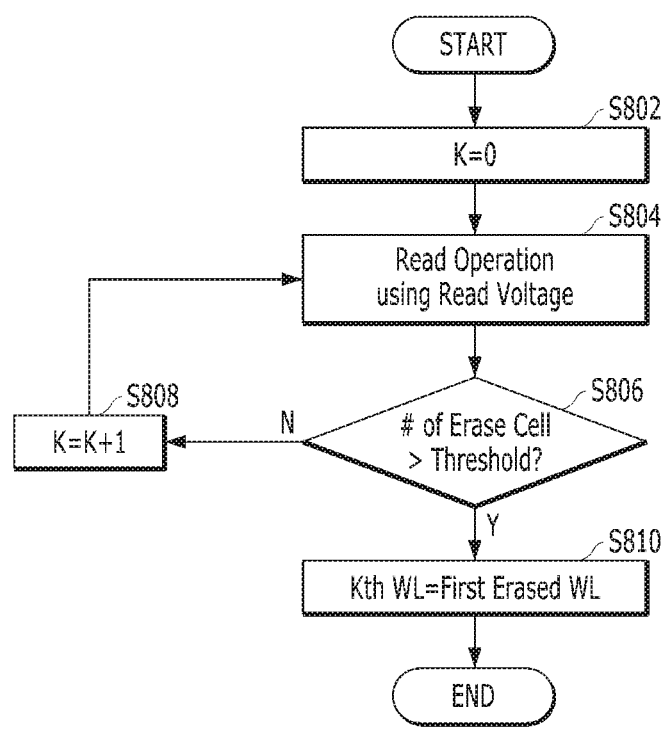
FIG. 8 is a flowchart illustrating a conventional open memory block scan operation of a memory system.

FIG. 8 is a flowchart illustrating a conventional open memory block scan operation of a memory system.

At step S802, the processor of the controller resets a parameter (i.e., K=0) to read word lines of an open memory block in the order that the word lines are programmed.

At step S804, the memory device performs a read operation on a $K^{th}$ word line according to control of the processor. Then, the memory device reads data to the processor by applying only the lowest read voltage among read voltages in a read voltage set to the $K^{th}$ word line.

At step S806, the processor determines whether the number of erased cells (i.e., #of Erase Cell) among memory cells exceeds the threshold value, based on the read data.

When the number of erased cells does not exceed the threshold value ("N" at step S806), at step S808, the processor changes the value of the parameter (i.e., K=K+1) to perform a read operation on the $(K+1)^{th}$ word line.

When the number of erased cells exceeds the threshold value ("Y" at step S806), at step S810, the processor determines that the $K^{th}$ word line is the first erased word line.

As described above, when the number of erased cells does not exceed the threshold value due to disturbance, even though the corresponding word line is an erased word line, the processor does not determine that the word line is an erased word line, only through the determination of step S806. Therefore, the processor determines that another word line which is not the first erased word line is the first erased word line.

Therefore, in accordance with the present embodiment, when error correction failed on data read through a first read operation of the memory device 150 on the word line using the first read voltage set including the first read voltage Vread1, the controller 130 may perform a second read operation by applying a second read voltage Vread2 greater than the first read voltage Vread1 to the corresponding word line.

In various embodiments, when the number of erased cells in the data read through the first read operation of the memory device 150 on the word line using the first read voltage set including the first read voltage Vread1 does not exceed the threshold value, the controller 130 may perform the second read operation by applying the second read voltage Vread2 greater than the first read voltage Vread1 to the corresponding word line.

The controller 130 may determine whether the corresponding page is an erased word line or programmed word line, depending on the number of memory cells which are determined to be erase memory cells as the result of the second read operation. For example, when the number of bits having a logical high value, e.g., value of '1', among bits stored in a page buffer as the result of the second read operation exceeds a threshold value, the controller 130 may determine that the corresponding page is an erased word line affected by disturbance.

In accordance with the present embodiment, the controller 130 may determine whether a page affected by disturbance is in a program state or erase state. Further, the controller 130 may perform a different operation depending on the determination result, thereby improving the performance and reliability of the memory system 110.

Figure 9:
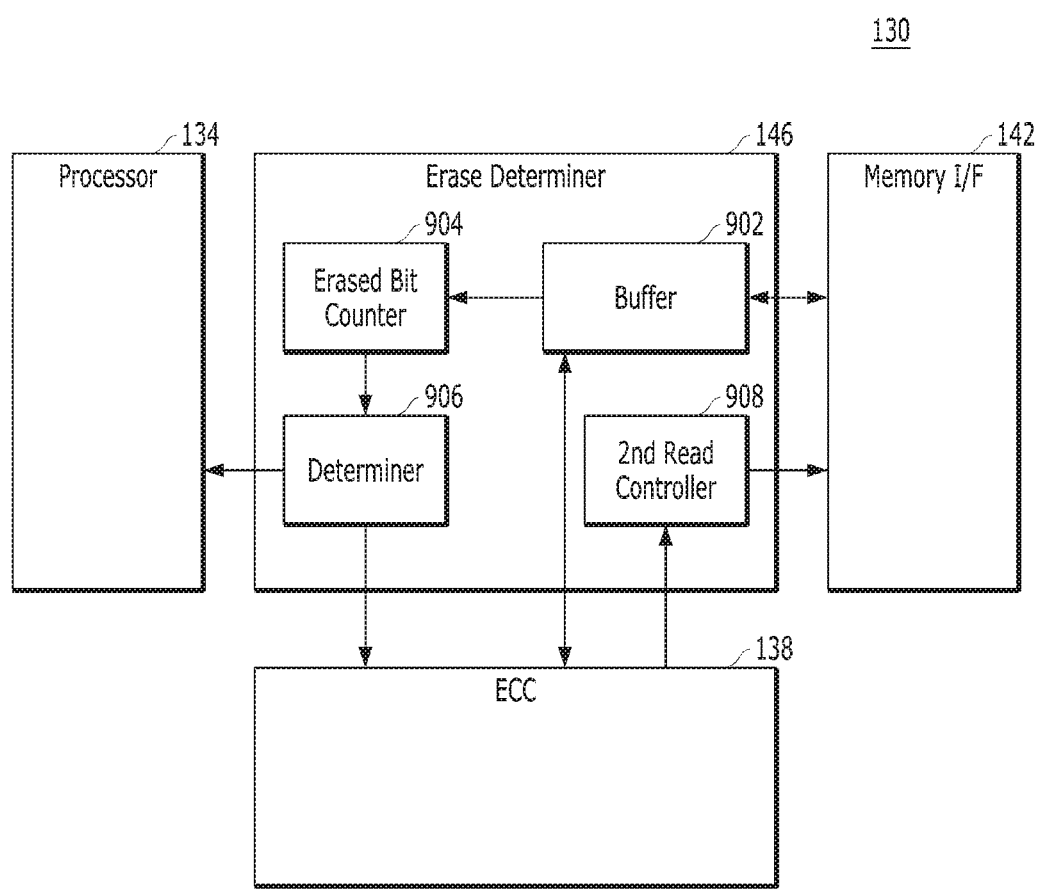
FIG. 9 is a block diagram illustrating a controller in accordance with an embodiment.

FIG. 9 illustrates a controller 130 in accordance with an embodiment.

Referring to FIG. 9, the controller 130 may include an erase determiner 146, a processor 134, an error correction code (ECC) component 138, and a memory interface (I/F) 142. Although not illustrated in FIG. 9, the controller 130 may further include the host interface 132, the PMU 140 and the memory 144, which have been described with reference to FIG. 2.

The erase determiner 146 may include a buffer 902, an erased bit counter 904, a determiner 906 and a second read controller 908. As described with reference to FIG. 2, the erase determiner 146 may be coupled to the processor 134, the memory interface 142 and the ECC component 138 through a bus, and communicate with the processor 134, the memory interface 142 and the ECC component 138.

The buffer 902 may buffer data read from the memory device 150.

The erased bit counter 904 may count the number of erased bits by referring to the values of bits included in the read data.

The determiner 906 may determine whether a word line corresponding to the read data is an erased word line, based on the number of erased bits. The determiner 906 may provide a control signal for controlling the ECC component 138 to perform error correction, or provide an erase signal to the processor 134, based on the number of erased bits. The erase signal may indicate that the word line is an erased word line.

When the ECC component 138 failed in error correction on the read data, the second read controller 908 may control the memory device 150 to perform a second read operation for determining whether the word line is an erased word line or programmed word line.

Figure 10:
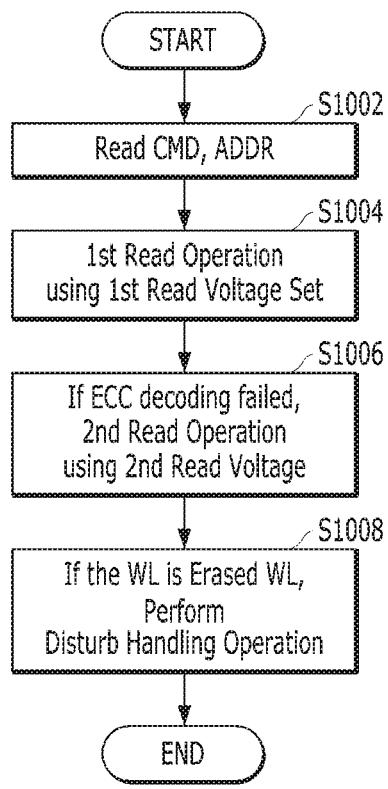
FIGS. 10 to 12 are flowcharts illustrating a read operation of a memory system in accordance with an embodiment.

FIG. 10 is a flowchart illustrating a read operation of a memory system, e.g., the memory system 110 of FIGS. 2 and 9, in accordance with an embodiment.

Referring to FIG. 10, at step S1002, the processor 134 may provide a first read command CMD and a read address ADDR to the memory device 150. The read address may correspond to a page to be read.

At step S1004, the memory device 150 may read data, by applying a first read voltage set to a word line corresponding to the read address, in response to the first read command. The memory device 150 may provide the read data to the buffer 902. The first read voltage set may include a plurality of read voltages to distinguish all threshold voltage states of a memory cell which is to be read. The first read voltage set may include the lowest read voltage among the plurality of read voltages, i.e., a first read voltage used as a reference voltage for distinguishing between the program state and the erase state.

When the number of erased cells among memory cells coupled to the word line does not exceed the threshold value, the ECC component 138 may perform error correction on the read data. When the error correction failed (or ECC decoding failed), the second read controller 908 may control the memory device 150 to perform a second read operation using a second read voltage greater than the first read voltage at step S1006. The second read operation may indicate a read operation for determining whether the word line is an erased word line or programmed word line. The second read voltage may be used as a reference voltage for distinguishing between the program state and the erase state.

When the result of the second read operation indicates that the word line WL is an erased word line, the processor 134 may perform a disturbance handling operation on a memory block corresponding to the word line at step S1008. The disturbance handling operation will be described with reference to FIG. 11.

Figure 11:
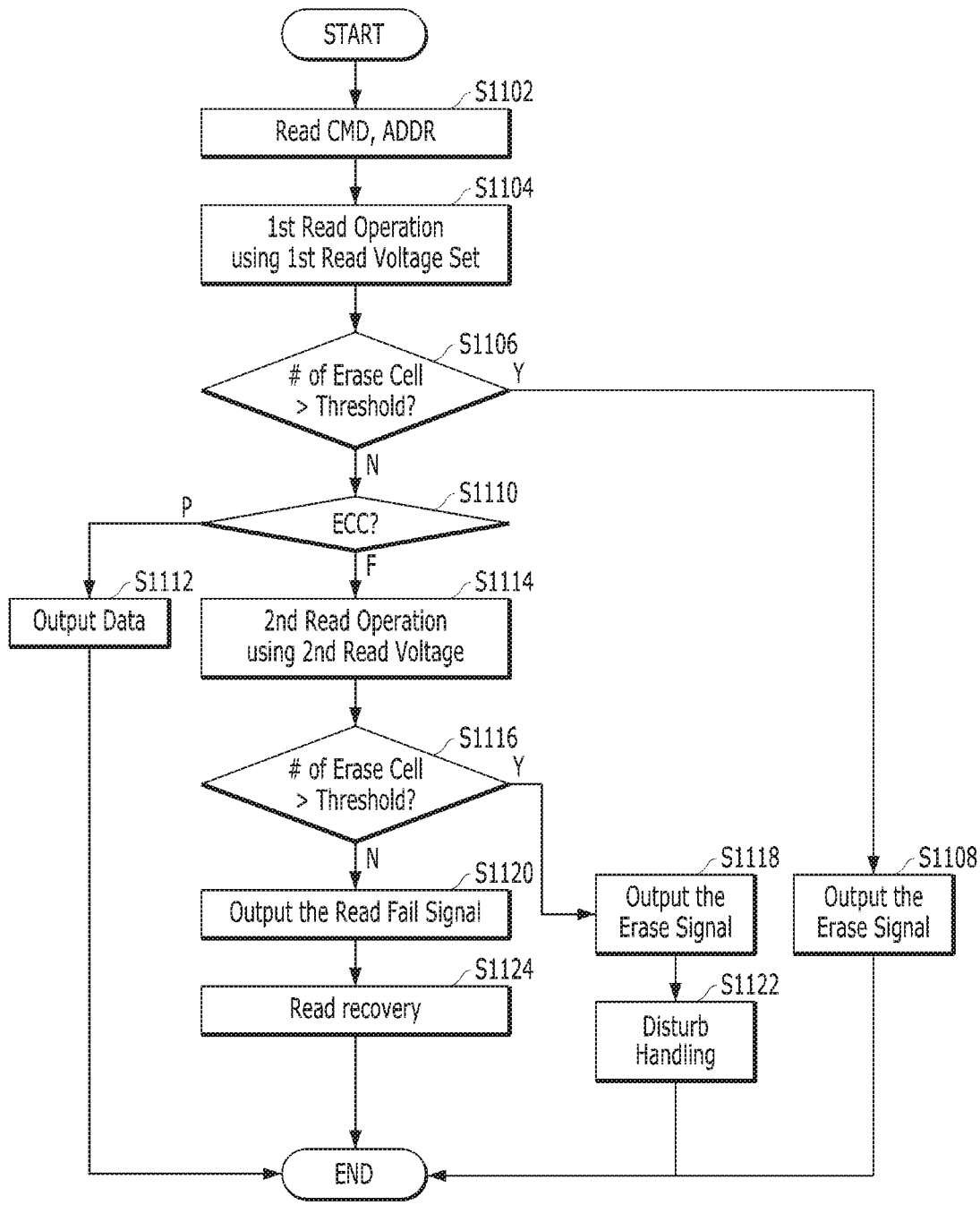

FIG. 11 is a flowchart illustrating a read operation of a memory system, e.g., the memory system 110 of FIGS. 2 and 9, in accordance with an embodiment.

Referring to FIG. 11, at step S1102, the processor 134 may provide a first read command CMD and a read address ADDR to the memory device 150 through the memory interface 142.

At step S1104, the memory device 150 may read data by performing a first read operation on a word line corresponding to the read address in response to the first read command. The memory device 150 may provide the read data to the buffer 902.

At step S1106, the erase determiner 146 may determine whether the number of erased cells (i.e., #of Erase Cell) included in the word line exceeds the threshold value, by referring to the read data.

Specifically, the erased bit counter 904 may count the number of erased bits in the read data, and provide the counted number of erased bits to the determiner 906. The determiner 906 may compare the number of erased bits to the threshold value, and thus determine whether the number of erased cells exceeds a threshold value.

When the number of erased cells (i.e., #of Erase Cell) among the memory cells exceeds the threshold value ("Y" at step S1106), at step S1108, the determiner 906 may provide an erase signal to the processor 134. The erase signal may indicate that the word line is an erased word line.

When the number of erased cells (i.e., #of Erase Cell) among the memory cells is less than or equal to the threshold value ("N" at step S1106), the determiner 906 may provide a control signal to the ECC component 138, and the buffer 902 may provide the read data to the ECC component 138, at step S1110. The ECC component 138 may perform error correction on the read data in response to the control signal.

When the error correction (i.e., ECC) succeeded ("P" at step S1110), the ECC component 138 may provide the corrected data to the memory 144 at step S1112. When the read operation is performed by a read request of the host, the processor 134 may provide the corrected data to the host 102.

When the error correction (i.e., ECC) failed ("F" at step S1110), the ECC component 138 may provide a read fail signal to the second read controller 908 at step S1114. The second read controller 908 may control the memory device 150 to perform a second read operation in response to the read fail signal.

When the memory device 150 provides the data stored in the page buffer to the buffer 902 through the second read operation, the erase determiner 146 may determine whether the number of erased cells among the memory cells coupled to the word line exceeds the threshold value, at step S1116. Specifically, the erased bit counter 904 may count the number of erased bits in the read data, and provide the counted number of erased bits to the determiner 906. The determiner 906 may compare the number of erased bits to the threshold value, and thus determine whether the number of corresponding erased cells exceeds the threshold value.

When the number of erased cells (i.e., #of Erase Cell) among the memory cells exceeds the threshold value ("Y" at step S1116), the word line may be an erased word line. Therefore, the determiner 906 may provide the erase signal to the processor 134 at step S1118.

When data are programmed to an erased word line affected by disturbance, the reliability of the data programmed to the word line may not be guaranteed. Therefore, the processor 134 may perform a disturbance handling operation in response to the erase signal at step S1122.

In accordance with the present embodiment, the disturbance handling operation may include an operation of closing a memory block including the word line such that data may not be programmed to the memory block any more.

In accordance with the present embodiment, the disturbance handling operation may include an operation of selecting a closed memory block as a victim block and performing garbage collection. Through the garbage collection operation, valid data of the victim block is moved to a target block.

When the number of erased cells (i.e., #of Erase Cell) among the memory cells is less than or equal to the threshold value ("N" at step S1116), it may indicate that a read fail occurred during the first read operation because the programmed word line was affected by disturbance. Therefore, the determiner 906 may provide a read fail signal to the memory 144 at step S1120.

At step S1124, the processor 134 may perform the above-described read recovery operation on the read address in response to the read fail signal.

Figure 12:
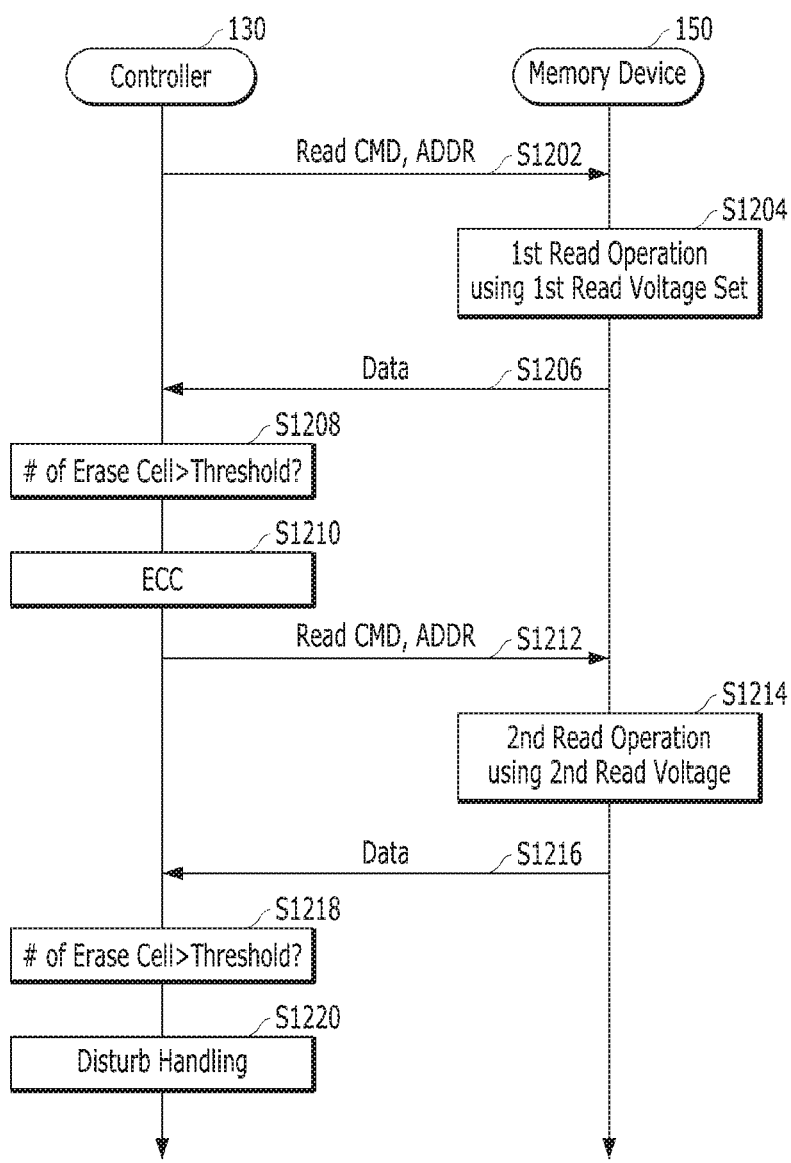

FIG. 12 is a flowchart illustrating an operation of a memory system, e.g., the memory system 110 of FIGS. 2 and 9, in accordance with an embodiment.

Referring to FIG. 12, at step S1202, the processor 134 may provide a first read command CMD and a read address ADDR to the memory device 150.

At step S1204, the memory device 150 may read data by performing a first read operation on a word line corresponding to the read address in response to the first read command. At step S1206, the memory device 150 may provide the read data to the buffer 902 of the controller 130.

At step S1208, the erase determiner 146 may determine whether the number of erased cells (i.e., #of Erase Cell) included in the word line exceeds a threshold value, by referring to the read data.

When the number of erased cells (i.e., #of Erase Cell) does not exceed the threshold value, the ECC component 138 may perform error correction (i.e., ECC) at step S1210.

When the error correction failed, the second read controller 908 may control the memory device 150 to perform a second read operation using a second read voltage greater than the first read voltage, at step S1212.

At step S1214, the memory device 150 may read data by performing the second read operation using the second read voltage. At step 1216, the memory device 150 may provide the read data to the buffer 902 of the controller 130.

At step S1218, the erase determiner 146 may determine whether the number of erased cells (i.e., #of Erase Cell) among memory cells coupled to the word line corresponding to the read address exceeds the threshold value.

When the number of erased cells (i.e., #of Erase Cell) exceeds the threshold value, the erase determiner 146 may provide the erase signal to the processor 134. In this case, the processor 134 may perform the above-described disturbance handling operation at step S1220.

in accordance with the present embodiment, the erase determiner 146 may previously determine whether a word line determined as error correction failure is an erased word line, and thus not perform a useless read recovery operation on the erased word line. Therefore, the performance of the memory system 110 may be improved. Furthermore, the processor 134 may perform the disturbance handling operation on the erased word line affected by disturbance, thereby improving the reliability of the memory system 110.

Figure 13:
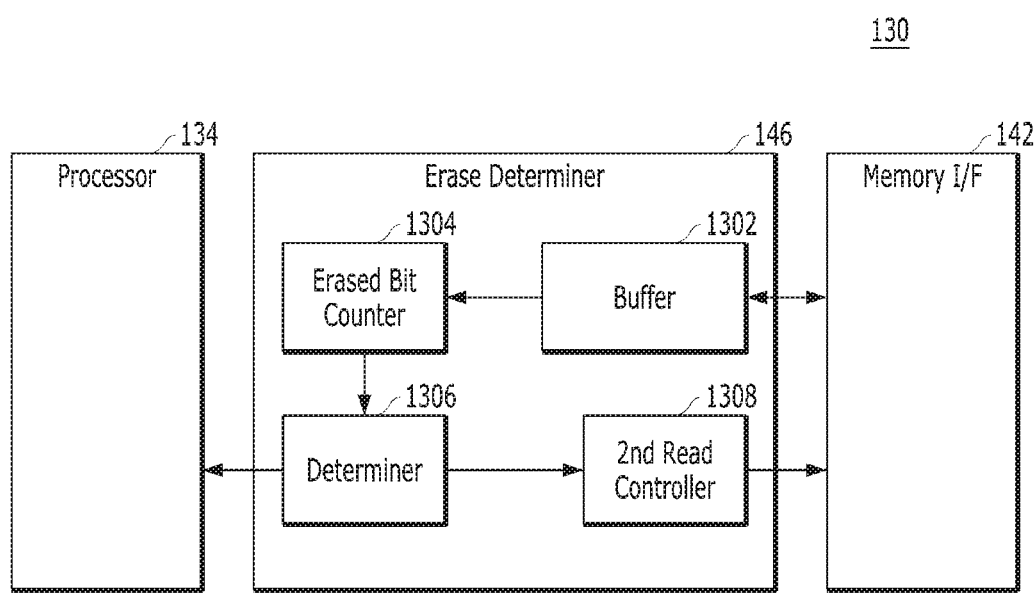
FIG. 13 illustrates a controller in accordance with an embodiment.

FIG. 13 illustrates a controller 130 in accordance with an embodiment.

Referring to FIG. 13, the controller 130 may include a processor 134, a memory interface (I/F) 142 and an erase determiner 146. Although not illustrated in FIG. 13, the controller 130 may further include the host interface 132, the ECC component 138, the PMU 140 and the memory 144, which have been described with reference to FIG. 2.

The erase determiner 146 may include a buffer 1302, an erased bit counter 1304, a determiner 1306 and a second read controller 1308. As described with reference to FIG. 2, the erase determiner 146 may be coupled to the processor 134 and the memory interface 142 through a bus and communicate with the processor 134 and the memory interface 142.

The buffer 1302 may buffer data read from the memory device 150.

The erased bit counter 1304 may count the number of erased bits by referring to the values of bits included in the read data.

The determiner 1306 may determine whether a word line corresponding to the read data is an erased word line, based on the number of erased bits.

The second read controller 1308 may control the memory device 150 to perform a second read operation for determining whether the word line is an erased word line or programmed word line, depending on the number of erased bits.

FIGS. 14 to 16B are flowcharts and diagrams illustrating an open block scan operation of a memory system, e.g., the memory system 110 of FIGS. 2, 3 and 13, in accordance with embodiments.

Figure 14:
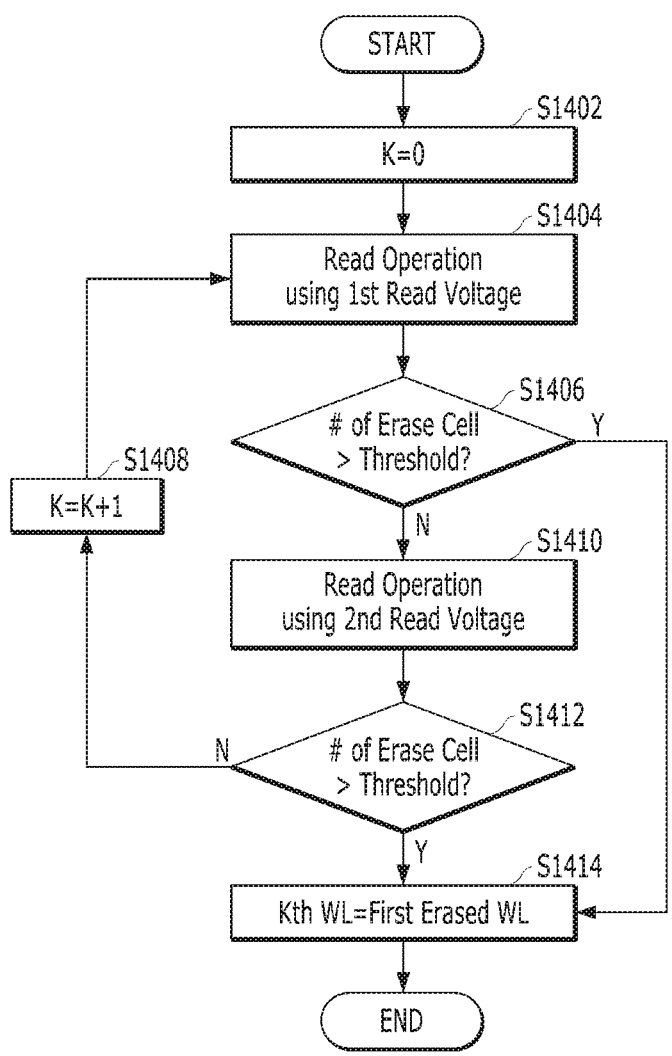
FIGS. 14 to 16B are diagrams and flowcharts illustrating a read operation of a memory system in accordance with an embodiment.

Referring to FIG. 14, when the memory system 110 is powered up, the processor 134 may reset a parameter (i.e., K=0) to read word lines of an open memory block in the order that the word lines are programmed, at step S1402.

At step S1404, the memory device 150 may read data by performing the first read operation on a $K^{th}$ word line in response to control of the processor 134. The memory device 150 may provide the read data to the buffer 1302. The voltage supply 310 may perform the first read operation by applying only the first read voltage among the read voltages in the first read voltage set. The first read voltage may correspond to the lowest voltage in the first read voltage set.

At step S1406, the erase determiner 146 may determine whether the number of erased cells (i.e., #of Erase Cell) among memory cells coupled to the $K^{th}$ word line exceeds a threshold value, by referring to the read data.

Specifically, when the erased bit counter 1304 counts the number of erased bits in the read data and provides the count value to the determiner 1306, the determiner 1306 may compare the count value to the threshold value.

When the number of erased cells (i.e., #of Erase Cell) exceeds the threshold value ("Y" at step S1406), the determiner 1306 may determine that a page corresponding to the $K^{th}$ word line is a first erased word line, at step S1414.

When the number of erased cells (i.e., #of Erase Cell) does not exceed the threshold value ("N" at step S1406), the determiner 1306 may provide a control signal to the second read controller 1308 at step S1410. The second read controller 1308 may control the memory device 150 to perform a second read operation on the $K^{th}$ word line in response to the control signal. The memory device 150 may read data by applying the second read voltage to the $K^{th}$ word line in response to the control signal. The memory device 150 may provide the read data to the buffer 1302.

At step S1412, the erase determiner 146 may determine whether the number of erased cells (i.e., #of Erase Cell) among the memory cells exceeds the threshold value, by referring to the read data.

Specifically, when the erased bit counter 1304 counts the number of erased bits in the read data and provides the count value to the determiner 1306, the determiner 1306 may compare the count value to the threshold value.

When the number of erased cells (i.e., #of Erase Cell) exceeds the threshold value ("Y" at step S1412), the determiner 1306 may determine that the $K^{th}$ word line is the first erased word line, at step S1414.

When the number of erased cells (i.e., #of Erase Cell) does not exceed the threshold value ("N" at step S1412), the determiner 1306 may provide the processor 134 with a program signal indicating that the word line was programmed. Further, the processor 134 may change the value of the parameter (i.e., K=K+1) to perform a read operation on the $(K+1)^{th}$ word line in response to the erase signal, at step S1408.

In FIG. 8, when the determination result of step S806 indicates that the number of erased cells does not exceed the threshold value, the processor unconditionally determines that the corresponding word line is a programmed word line. In accordance with the embodiment of FIG. 14, however, the processor 134 may determine whether the corresponding word line is an erased word line affected by disturbance or a programmed word line, through the second read operation, thereby finding the first erased word line more accurately.

As described with reference to FIG. 14, the present embodiment may be applied to that algorithm that searches for and finds the first erased word line by sequentially reading word lines in the order in which the word lines are programmed. Alternatively, the open memory block scan operation may be executed as an algorithm that finds the first programmed word line by reading word lines in the reverse order of the order in which the word lines are programmed, or executed as a binary search algorithm. Referring to FIGS.

15, 16A and 166, it will be apparent that the present embodiment may be applied to various open memory block scan operations.

Figure 15:
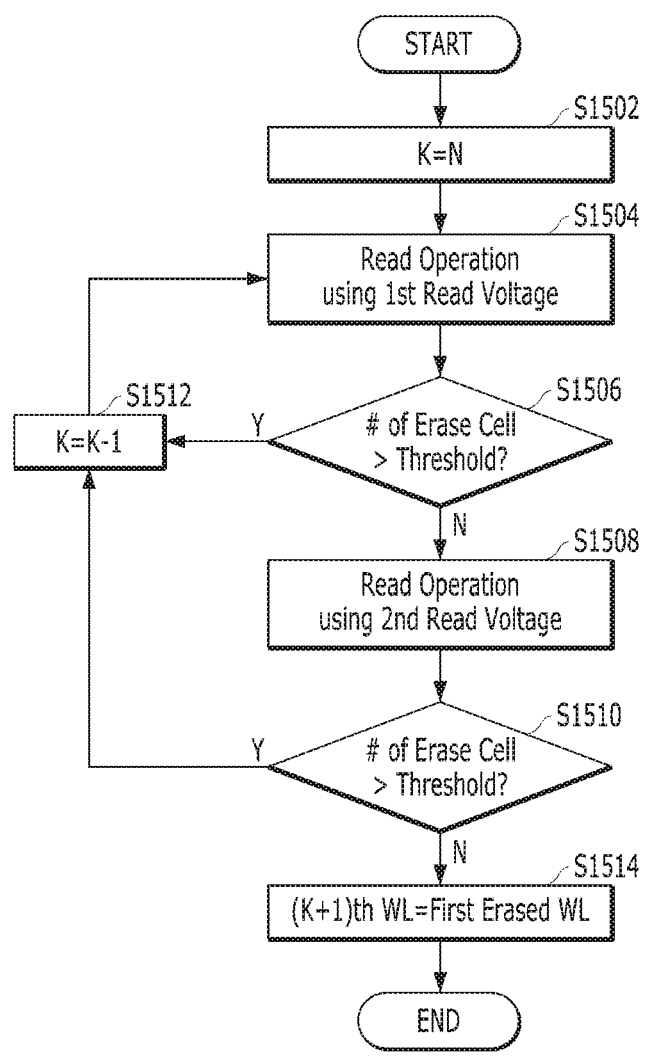

Referring to FIG. 15, when the memory system 110 is powered up, the processor 134 may reset a parameter (i.e., K=N) to read word lines of an open memory block in the reverse order in which the word lines are programmed, at step S1502.

At step S1504, the memory device 150 may read data by performing a first read operation on a $K^{th}$ word line in response to control of the processor 134. The memory device 150 may provide the read data to the buffer 1302.

At step S1506, the erase determiner 146 may determine whether the number of erased cells (i.e., #of Erase Cell) among memory cells coupled to the $K^{th}$ word line exceeds a threshold value, by referring to the read data.

When the number of erased cells (i.e., #of Erase Cell) exceeds the threshold value ("Y" at step S1506), the determiner 1306 may provide an erase signal to the processor 134. Further, the processor 134 may change the value of the parameter (i.e., K=K-1) to perform a read operation on the $(K-1)^{th}$ word line in response to the erase signal, at step S1512.

When the number of erased cells (i.e., #of Erase Cell) does not exceed the threshold value ("N" at step S1506), the determiner 1306 may provide a control signal to the second read controller 1308 at step S1508. The second read controller 1308 may control the memory device 150 to perform a second read operation on the $K^{th}$ word line in response to the control signal. The memory device 150 may read data by applying the second read voltage to the $K^{th}$ word line in response to the control signal. The memory device 150 may provide the read data to the buffer 1302.

At step S1510, the erase determiner 146 may determine whether the number of erased cells (i.e., #of Erase Cell) among the memory cells exceeds the threshold value, by referring to the read data.

When the number of erased cells (i.e., #of Erase Cell) exceeds the threshold value ("Y" at step S1510), the determiner 1306 may provide the erase signal to the processor 134. Further, the processor 134 may change the value of the parameter (i.e., K=K-1) to perform a read operation on the $(K-1)^{th}$ word line in response to the erase signal, at step S1512.

When the number of erased cells (i.e., #of Erase Cell) does not exceed the threshold value ("N" at step S1510), the processor 134 may determine that the $K^{th}$ word line is the finally programmed word line, at step S1514. That is, the processor 134 may determine that the $(K+1)^{th}$ word line is the first erased word line.

Figure 16A:
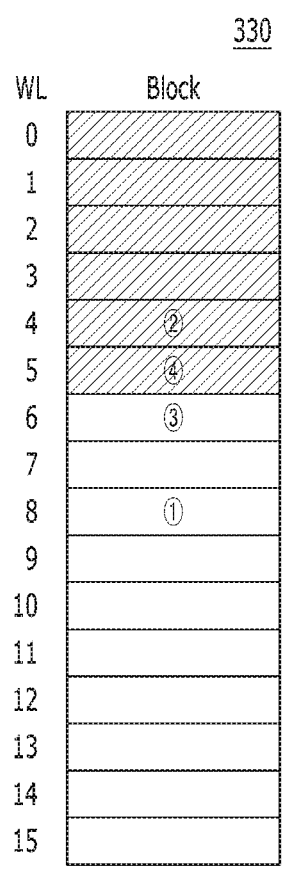

FIGS. 16A and 166 are a diagram and flowchart illustrating an example to which the present embodiment is applied, during an open memory block scan operation based on a binary search method.

FIG. 16A illustrates an open memory block including 16 word lines. In FIG. 16A, hatched portions indicate that word lines WL0 to WL5 are programmed word lines, and empty portions indicate that word lines WL6 to WL15 are erased word lines. In FIG. 16A, ①, ②, ③ and ④ sequentially represent word lines where read operations are performed until the first erased word line is found during the open memory block scan operation based on the binary search method. For example, when the open memory block scan is started, the processor 134 may control the memory device 150 to read the middle word line WL8. When the middle word line WL8 is an erased word line, the processor 134 may narrow the range and control the memory device 150 to read the high word line WL4. The specific operation will be described with reference to FIG. 16B.

Figure 16B:
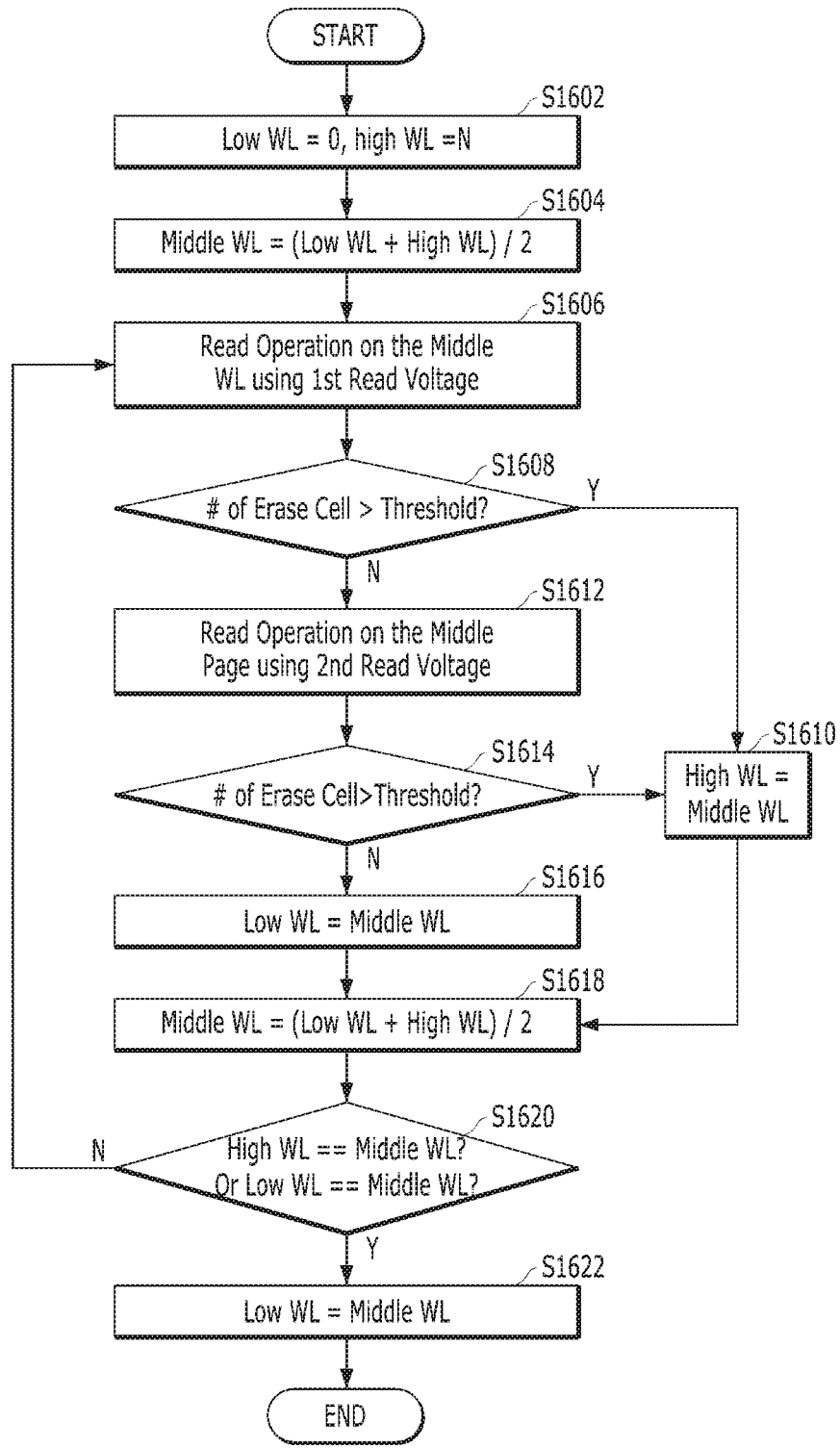

Referring to FIG. 16B, when the memory system 110 is powered up, the processor 134 may set the zeroth word line, for example, WL0 of FIG. 3 to a low word line Low WL (i.e., Low WL=0), and set the $N^{th}$ word line, for example, WLn of FIG. 3 to a high word line High WL (i.e., High WL=N), at step S1602.

At step S1604, the processor 134 may set the middle word line between the low word line and the high word line to a middle word line Middle WL. In other words, the processor 134 may set: Middle WL=(Low WL+High WL)/2.

At step S1606, the memory device 150 may read data by performing a first read operation on the middle word line in response to control of the processor 134. The memory device 150 may provide the read data to the buffer 1302.

At step S1608, the erase determiner 146 may determine whether the number of erased cells (i.e., #of Erase Cell) among memory cells coupled to the middle word line exceeds a threshold value, by referring to the read data.

When the number of erased cells (i.e., #of Erase Cell) exceeds the threshold value ("Y" at step S1608), the determiner 1306 may provide an erase signal to the processor 134, and the processor 134 may set the middle word line to a new high word line in response to the erase signal, at step S1610. In other words, the processor 134 may set: High WL=Middle WL.

When the number of erased cells (i.e., #of Erase Cell) does not exceed the threshold value ("N" at step S1608), the determiner 1306 may provide a control signal to the second read controller 1308 at step S1612. The second read controller 1308 may control the memory device 150 to perform a second read operation on the $K^{th}$ word line in response to the control signal. The memory device 150 may read data by applying the second read voltage to the $K^{th}$ word line in response to the control signal. The memory device 150 may provide the read data to the buffer 1302.

At step S1614, the erase determiner 146 may determine whether the number of erased cells (i.e., #of Erase Cell) among the memory cells exceeds the threshold value, by referring to the read data.

When the number of erased cells (i.e., #of Erase Cell) exceeds the threshold value ("Y" at step S1614), the determiner 1306 may provide the erase signal to the processor 134, and the processor 134 may set the middle word line to a new high word line in response to the erase signal, at step S1610. In other words, the processor 134 may set: High WL=Middle WL.

When the number of erased cells (i.e., #of Erase Cell) does not exceed the threshold value ("N" at step S1614), the determiner 1306 may provide a program signal to the processor 134, and the processor 134 may set the middle word line to a new low word line in response to the program signal, at step S1616. In other words, the processor 134 may set: Low WL=Middle WL.

At step S1618, the processor 134 may set the middle word line between the new high word line and the new low word line to a new middle word line. In other words, the processor 134 may set: Middle WL=(Low WL+High WL)/2.

At step S1620, the processor 134 may determine whether the new high word line coincides with the new middle word line (i.e., High WL==Middle WL) or the new low word line coincides with the new middle word line (i.e., Low WL==Middle WL).

When the determination result of step S1620 indicates that the new high or low word line does not coincide with the new middle word line ("N" at step S1620), the processor 134 may perform the operations of steps S1606 to S1618 on the new high word line, low word line and middle word line.

When the determination result of step S1620 indicates that the new high or low word line coincides with the new middle word line ("Y" at step S1620), the processor 134 may set a page corresponding to the new middle word line to the first erased word line at step S1622. In other words, the processor 134 may set: Low WL=Middle WL.

In accordance with embodiments, when the open memory block scan operation is performed, the processor 134 may accurately find the first erased word line by determining whether a page determined as error correction failure is an erased word line or programmed word line. Therefore, the accuracy of the sudden power-off recovery operation may be improved, which makes it possible to improve the reliability of the memory system 110.

FIGS. 17 to 25 are diagrams schematically illustrating application examples of the data processing system of FIGS. 1 to 16B according to various embodiments.

Figure 17:
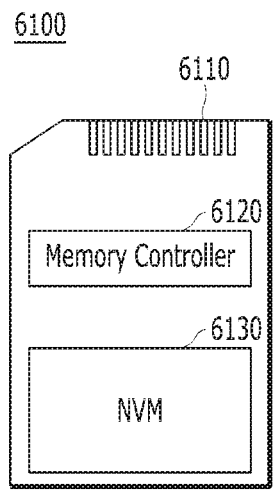
FIGS. 17 to 25 are diagrams schematically illustrating application examples of a data processing system in accordance with various embodiments of the present invention.

FIG. 17 is a diagram schematically illustrating a data processing system including the memory system in accordance with an embodiment. FIG. 17 schematically illustrates a memory card system 6100 to which the memory system in accordance with an embodiment is applied.

Referring to FIG. 17, the memory card system 6100 may include a memory controller 6120, a memory device 6130 and a connector 6110.

More specifically, the memory controller 6120 may be connected to the memory device 6130 embodied by a nonvolatile memory (NVM), and configured to access the memory device 6130. For example, the memory controller 6120 may be configured to control read, write, erase and background operations of the memory device 6130. The memory controller 6120 may be configured to provide an interface between the memory device 6130 and a host (not shown), and drive firmware for controlling the memory device 6130. That is, the memory controller 6120 may correspond to the controller 130 of the memory system 110 described with reference to FIGS. 1 and 2, and the memory device 6130 may correspond to the memory device 150 of the memory system 110 described with reference to FIGS. 1 and 2.

Thus, as shown in FIG. 2, the memory controller 6120 may include a random access memory (RAM), a processor, a host interface, a memory interface and an error correction component.

The memory controller 6120 may communicate with an external device, for example the host 102 of FIG. 1 and FIG. 2, through the connector 6110. For example, as described with reference to FIG. 2, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), advanced technology attachment (ATA), serial-ATA, parallel-ATA, small computer system interface (SCSI), enhanced small disk interface (EDSI), integrated drive electronics (IDE), Firewire, universal flash storage (UFS), wireless fidelity (Wi-Fi or WiFi) and Bluetooth. Thus, the memory system and the data processing system may be applied to wired and/or wireless electronic devices, particularly mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may be integrated to form a solid-state driver (SSD). Also, the memory controller 6120 and the memory device 6130 may form a memory card such as a personal computer (PC) card (e.g., personal computer memory card international association (PCMCTA)), a compact flash (CF) card, a smart media card (e.g., SM and SMC), a memory stick, a multimedia card (e.g., MMC, RS-MMC, MMCmicro and eMMC), an secured digital (SD) card (e.g., SD, miniSD, microSD and SDHC) and a universal flash storage (UFS).

Figure 18:
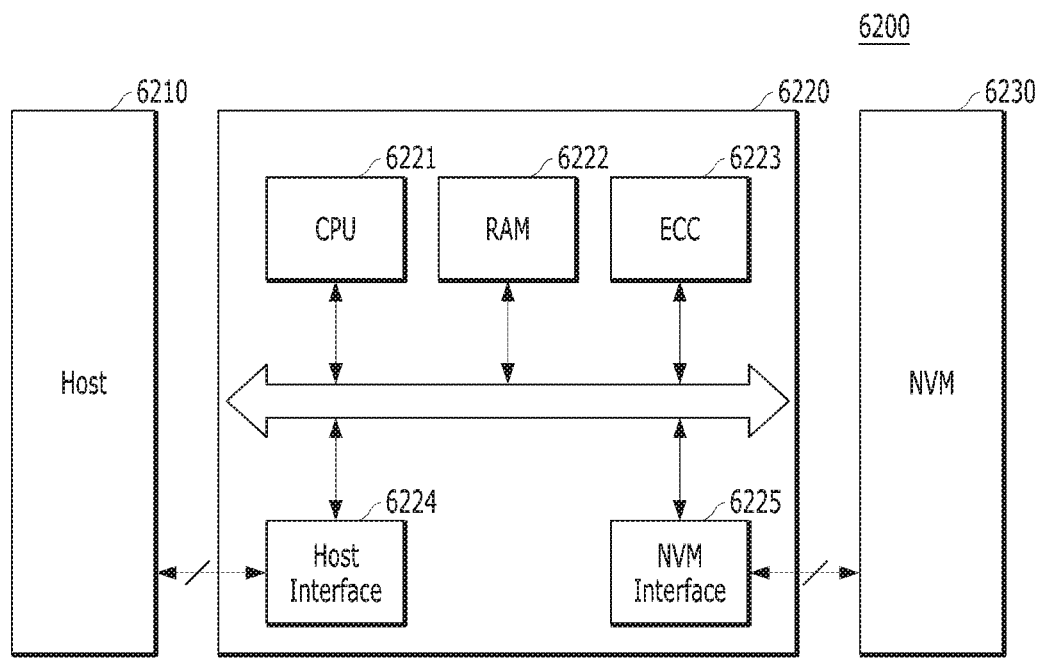

FIG. 18 is a diagram schematically illustrating another example of a data processing system 6200 including the memory system in accordance with an embodiment.

Referring to FIG. 18, the data processing system 6200 may include a memory device 6230 having one or more nonvolatile memories (NVMs) and a memory controller 6220 for controlling the memory device 6230. The data processing system 6200 may serve as a storage medium such as a memory card (e.g., CF, SD, micro-SD or the like) or USB device, as described with reference to FIG. 2. The memory device 6230 may correspond to the memory device 150 in the memory system 110 illustrated in FIGS. 1 and 2, and the memory controller 6220 may correspond to the controller 130 in the memory system 110 illustrated in FIGS. 1 and 2.

The memory controller 6220 may control a read, write or erase operation on the memory device 6230 in response to a request of the host 6210, and the memory controller 6220 may include one or more central processing units (CPUs) 6221, a buffer memory such as a random access memory (RAM) 6222, an error correction code (ECC) circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the memory device 6230 to operate at higher speed.

The ECC circuit 6223 may correspond to the ECC component 138 of the controller 130 illustrated in FIG. 2. As described with reference to FIG. 2, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 2, the ECC circuit 6223 may correct an error using low density parity check (LDPC) code, Bose-Chaudhri-Hocquenghem (BCH) code, turbo code, Reed-Solomon (RS) code, convolution code, recursive systematic code (RSC) or coded modulation such as trellis-coded modulation (TCM) or block coded modulation (BCM).

The memory controller 6220 may exchange data with the host 6210 through the host interface 6224, and exchange data with the memory device 6230 through the NVM interface 6225. The host interface 6224 may be connected to the host 6210 through a parallel advanced technology attachment (PATA) bus, serial advanced technology attachment (SATA) bus, small computer system interface (SCSI), universal serial bus (USB), peripheral component interconnect-express (PCIe) or NAND interface. The memory controller 6220 may have a wireless communication function with a mobile communication protocol such as wireless fidelity (WiFi) or long term evolution (LTE). The memory controller 6220 may be connected to an external device, for example, the host 6210 or another external device, and then transmit and/or receive data to and/or from the external device. In particular, as the memory controller 6220 is configured to communicate with the external device through one or more of various communication protocols, the memory system and the data processing system may be applied to wired and/or wireless electronic devices, particularly a mobile electronic device.

Figure 19:
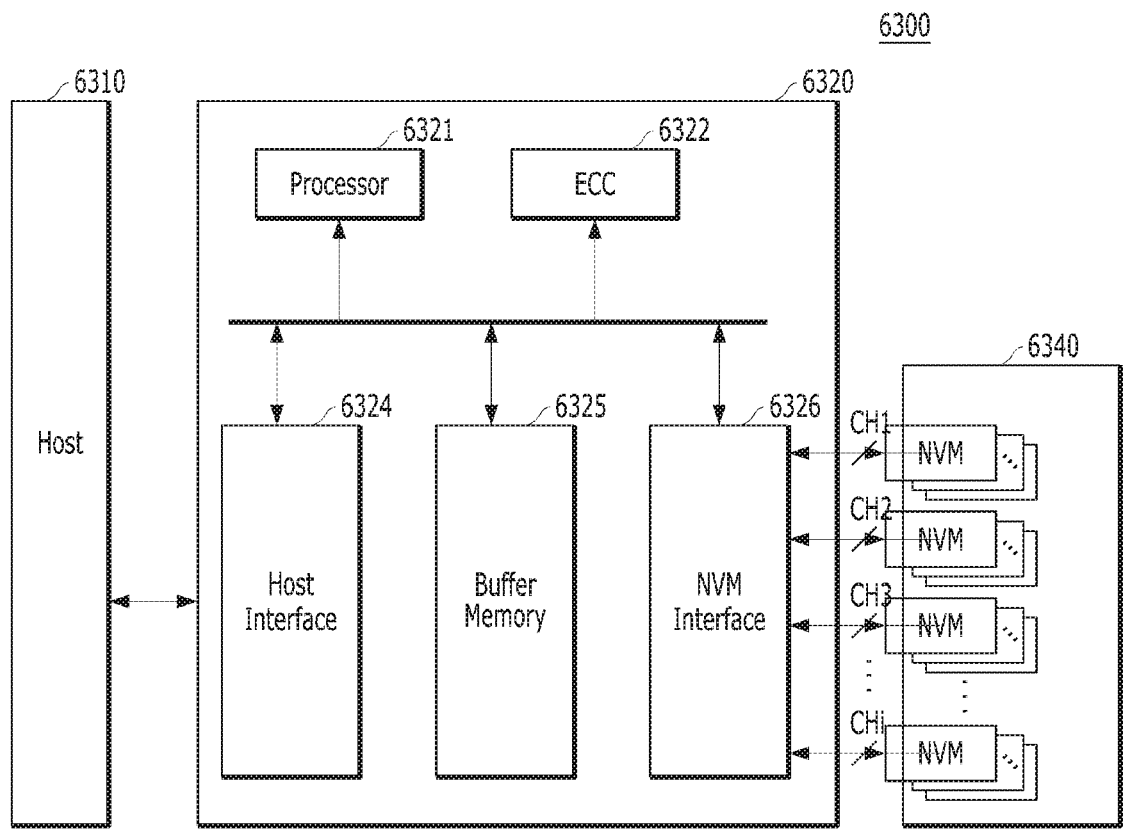

FIG. 19 is a diagram schematically illustrating another example of the data processing system including the memory system in accordance with an embodiment. FIG. 19 schematically illustrates a solid state drive (SSD) 6300 to which the memory system may be applied.

Referring to FIG. 19, the SSD 6300 may include a controller 6320 and a memory device 6340 including a plurality of nonvolatile memories (NVMs). The controller 6320 may correspond to the controller 130 in the memory system 110 of FIGS. 1 and 2, and the memory device 6340 may correspond to the memory device 150 in the memory system of FIGS. 1 and 2.

More specifically, the controller 6320 may be connected to the memory device 6340 through a plurality of channels CH1 to CHi. The controller 6320 may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as dynamic random access memory (DRAM), synchronous DRAM (SDRAM), double data rate (DDR) SDRAM, low power DDR (LPDDR) SDRAM and graphics RAM (GRAM) or nonvolatile memories such as ferroelectric RAM (FRAM), resistive RAM (RRAM or ReRAM), spin-transfer torque magnetic RAM (STT-MRAM) and phase-change RAM (PRAM). By way of example, FIG. 19 illustrates that the buffer memory 6325 is disposed in the controller 6320. However, the buffer memory 6325 may be disposed externally to the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 and 2 is applied may be provided to embody a data processing system, for example, a redundant array of independent disks (RAID) system. The RAID system ay include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 20:
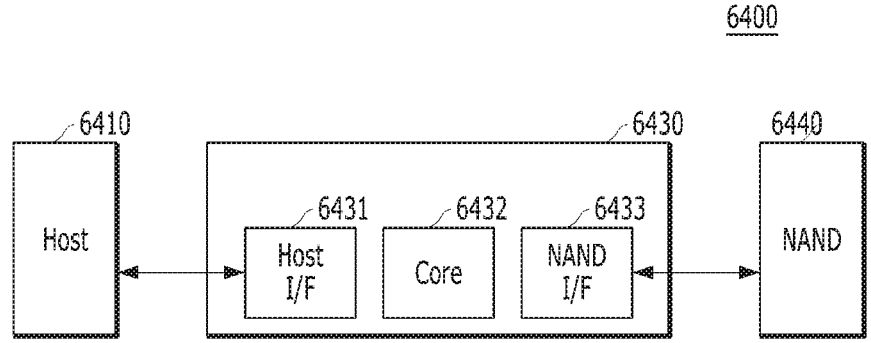

FIG. 20 is a diagram schematically illustrating another example of the data processing system including the memory system in accordance with an embodiment. FIG. 20 schematically illustrates an embedded multi-media card (eMMC) 6400 to which the memory system may be applied.

Referring to FIG. 20, the eMMC 6400 may include a controller 6430 and a memory device 6440 embodied by one or more NAND flash memories. The controller 6430 may correspond to the controller 130 in the memory system 110 of FIGS. 1 and 2, and the memory device 6440 may correspond to the memory device 150 in the memory system 110 of FIGS. 1 and 2.

More specifically, the controller 6430 may be connected to the memory device 6440 through a plurality of channels. The controller 6430 may include one or more cores 6432, a host interface (I/F) 6431 and a memory interface, for example, a NAND interface (I/F) 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 2. Furthermore, the host interface 6431 may serve as a serial interface, for example, Ultra High Speed (UHS)-I and UHS-II interface.

Each of the memory controller 6120, the memory controller 6220, the controller 6320 and the controller 6430, which have been described with reference to FIGS. 17 to 20, may include the erase determiner 146 described with reference to FIG. 1. The erase determiner 146 can accurately determine whether word lines included in the memory device 6130, the memory device 6230, the memory device 6340 and the memory device 6440 are erased word lines, thereby improving the reliability and performance of the data processing system.

FIGS. 21 to 24 are diagrams schematically illustrating other examples of the data processing system including the memory system in accordance with one or more embodiments. FIGS. 21 to 24 schematically illustrate universal flash storage (UFS) systems to which the memory system may be applied.

The memory systems in accordance with the various embodiments, described with reference to FIGS. 1 to 20, can be applied to the UFS described with reference to FIGS. 21 to 24.

Referring to FIGS. 21 to 24, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired and/or wireless electronic devices or particularly mobile electronic devices, the UFS devices 6520, 6620, 6720 and 6820 may serve as embedded UFS devices. The UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired and/or wireless electronic devices or particularly mobile electronic devices through UFS protocols. The UFS devices 6520, 6620, 6720 and 6820 and the UFS cards 6530, 6630, 6730 and 6830 may be embodied by the memory system 110 illustrated in FIGS. 1 and 2. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 18 to 20, and the UFS cards 6530, 6630, 6730 and 6830 may be embodied in the form of the memory card system 6100 described with reference to FIG. 17.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, universal storage bus (USB) flash drives (UFDs), multi-media card (MMC), secure digital (SD), mini-SD, and micro-SD.

Figure 21:
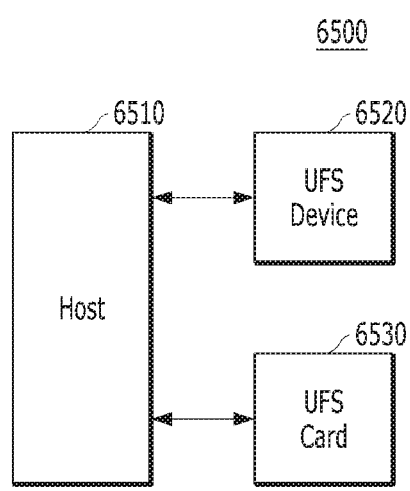

In the UFS system 6500 illustrated in FIG. 21, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the embodiment of FIG. 21, the configuration in which one UFS device 6520 and one UFS card 6530 are connected to the host 6510 is illustrated by way of example. However, in another embodiment, a plurality of UFS devices and UFS cards may be connected in parallel or in the form of a star to the host 6510, and a plurality of UFS cards may be connected in parallel or in the form of a star to the UFS device 6520 or connected in series or in the form of a chain to the UFS device 6520.

Figure 22:
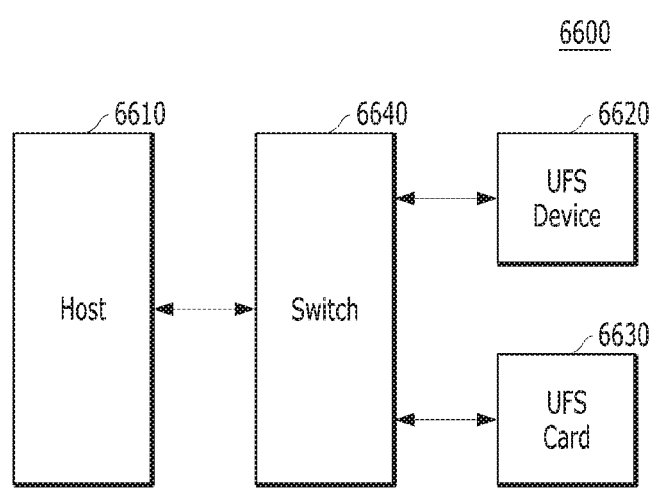

In the UFS system 6600 illustrated in FIG. 22, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the embodiment of FIG. 22, the configuration in which one UFS device 6620 and one UFS card 6630 are connected to the switching module 6640 is illustrated by way of example. However, in another embodiment, a plurality of UFS devices and UFS cards may be connected in parallel or in the form of a star to the switching module 6640, and a plurality of UFS cards may be connected in series or in the form of a chain to the UFS device 6620.

Figure 23:
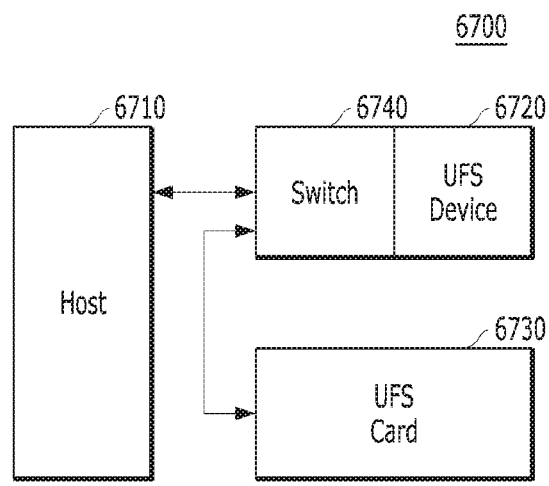

In the UFS system 6700 illustrated in FIG. 23, each of the host 6710, the UFS device 6720 and the UFS card 6730 may include UniPro. The host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro, and the switching module 6740 may be integrated as one module with the UFS device 6720 within or externally to the UFS device 6720. In the embodiment of FIG. 23, the configuration in which one UFS device 6720 and one UFS card 6730 are connected to the switching module 6740 is illustrated by way of example. However, in another embodiment, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 24:
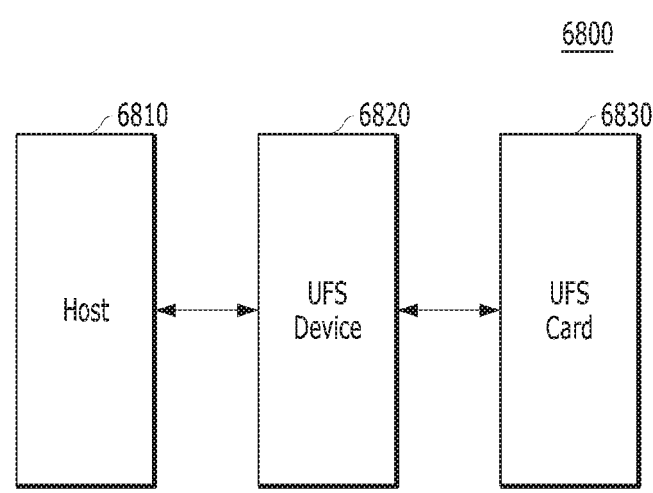

In the UFS system 6800 illustrated in FIG. 24, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target identifier (ID) switching operation. The host 6810 and the UFS card 6830 may communicate with each other through target ID switching between the M-PHY and UniPro modules of the UFS device 6820. In the embodiment of FIG. 24, the configuration in which one UFS device 6820 is connected to the host 6810 and one UFS card 6830 is connected to the UFS device 6820 is illustrated by way of example. However, in another embodiment, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 25:
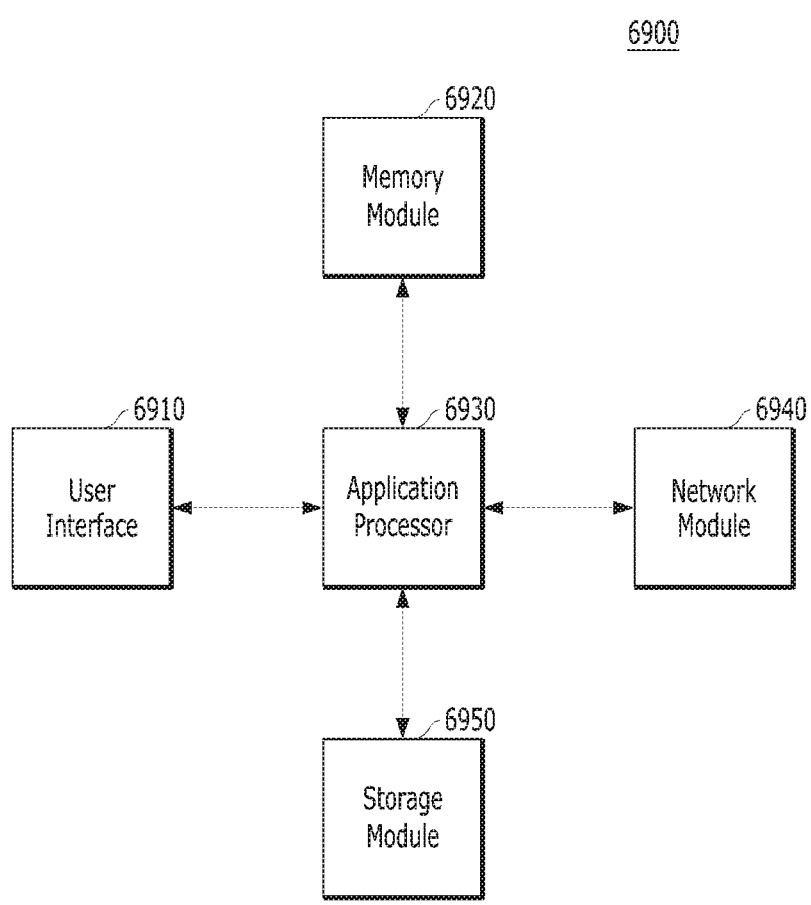

FIG. 25 is a diagram schematically illustrating another example of the data processing system including the memory system in accordance with an embodiment. FIG. 25 is a diagram schematically illustrating a user system 6900 to which the memory system may be applied.

Referring to FIG. 25, the user system 6900 may include a user interface 6910, a memory module 6920, an application processor 6930, a network module 6940, and a storage module 6950.

More specifically, the application processor 6930 may drive components included in the user system 6900, for example, an operating system (OS), and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, DDR2 SDRAM, DDR3 SDRAM, LPDDR SDARM, LPDDR3 SDRAM or LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on Package on Package (PoP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIGS. 1 and 2. Furthermore, the storage module 6950 may be embodied as an SSD, eMMC and UFS as described above with reference to FIGS. 19 to 24.

In an embodiment, the storage module 6950 may further perform the second read operation on a word line depending on data read through the first read operation on the word line, in order to improve the reliability and performance. Therefore, the storage module 6950 can accurately identify an erased word line.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIGS. 1 and 2 is applied to a mobile electronic device of the user system 6900, the application processor 6930 may control overall operations of the mobile electronic device, and the network module 6940 may serve as a communication module for controlling wired and/or wireless communication with an external device. The user interface 6910 may display data processed by the processor 6930 on a display/touch module of the mobile electronic device, or support a function of receiving data from the touch panel.

Embodiments of the present invention provide a memory system capable of improving performance and reliability by accurately determining an erase page, and an operation method thereof.

Although various embodiments have been illustrated and described, it will be apparent to those skilled in the art in light of the present disclosure that various changes and modifications may be made without departing from the spirit and scope of the invention as defined in the following claims.

What is claimed is:

1. An operation method of a memory system, comprising:
performing a first read operation on a word line corresponding to a read command, using a read voltage set including a first read voltage for distinguishing a state of a memory cell into a program state or an erase state;
performing a second read operation on the word line for determining whether a page corresponding to the word line is an erased page including memory cells with distorted threshold voltages by using a second read voltage greater than the first read voltage, depending on whether error correction on data read through the first read operation fails; and
outputting an erase signal in response to the read command without performing a read retry operation and a soft decision operation, when the page is determined to be the erased page as the result of the second read operation.

2. The operation method of claim 1, further comprising:
selecting the closed memory block as a victim block for a garbage collection operation; and
moving valid data of the victim block to a target block, when the garbage collection operation is triggered.

3. The operation method of claim 1, further comprising:
performing one or more of the read retry operation and the soft decision operation on the word line, when the page is determined to be a programmed page as the result of the second read operation.

4. The operation method of claim 1, further comprising determining that the page is the erased page, according to the number of bits having a set value as the result of the second read operation.

5. An operation method of a memory system, comprising:
performing an open block scanning operation of searching for an erased page by repeatedly determining whether each of pages included in an open memory block is an erased page, when the memory system is powered up after a sudden power-off (SPO); and
performing a repair operation on the erased page,
wherein the determining of whether a page is the erased page comprises:

performing a first read operation by applying on a word line a first read voltage, which is for distinguishing whether a state of a memory cell is a program state or an erase state, to the word line;

performing a second read operation by applying on the word line a second read voltage greater than the first read voltage, depending on the number of memory cells determined as erased cells as a result of the first read operation; and determining that a page corresponding to the word line is an erased page including memory cells with distorted threshold voltages, according to the result of the second read operation, wherein the performing of the open block scan operation comprises searching for the erased page for the repair operation, among the pages of the open memory block through a binary search method.

6. The operation method of claim 5, wherein the performing of the open block scan operation comprises searching for the erased page for the repair operation, among the pages of the open memory block, in the order that the pages are programmed.

7. The operation method of claim 5, further comprising determining, as a closed memory block, the open memory block when the page is determined to be the erased page according to the result of the second read operation.

8. An operation method of a memory system, comprising:

performing an open block scanning operation of searching for an erased page by repeatedly determining whether each of pages included in an open memory block is an erased page, when the memory system is powered up after a sudden power-off (SPO); and performing a repair operation on the erased page, wherein the determining of whether a page is the erased page comprises:

performing a first read operation by applying on a word line a first read voltage, which is for distinguishing whether a state of a memory cell is a program state or an erase state, to the word line;

performing a second read operation by applying on the word line a second read voltage greater than the first read voltage, depending on the number of memory cells determined as erased cells as a result of the first read operation; and determining that a page corresponding to the word line is an erased page including memory cells with distorted threshold voltages, according to the result of the second read operation, wherein the performing of the open block scan operation comprises searching for the erased page for the repair operation, among the pages of the open memory block, in the reverse order in which the pages are programmed.

* * * * *